US012382807B2

(12) United States Patent
Park et al.

(10) Patent No.: US 12,382,807 B2
(45) Date of Patent: Aug. 5, 2025

(54) DISPLAY APPARATUS AND MANUFACTURING METHOD OF THE SAME

(71) Applicant: Samsung Display Co., Ltd., Yongin-si (KR)

(72) Inventors: Heemin Park, Yongin-si (KR); Joongu Lee, Yongin-si (KR); Hyejin Gwark, Yongin-si (KR); Arong Kim, Yongin-si (KR); Jaeik Kim, Yongin-si (KR); Jungsun Park, Yongin-si (KR); Yeonhwa Lee, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 480 days.

(21) Appl. No.: 17/967,707

(22) Filed: Oct. 17, 2022

(65) Prior Publication Data
US 2023/0133603 A1 May 4, 2023

(30) Foreign Application Priority Data
Oct. 28, 2021 (KR) .................. 10-2021-0145857

(51) Int. Cl.
*H10K 59/131* (2023.01)
*H10K 59/12* (2023.01)
*H10K 71/00* (2023.01)

(52) U.S. Cl.
CPC ......... *H10K 59/1315* (2023.02); *H10K 71/00* (2023.02); *H10K 59/1201* (2023.02)

(58) Field of Classification Search
CPC . H10K 59/1315; H10K 71/00; H10K 59/1201
See application file for complete search history.

(56) References Cited

U.S. PATENT DOCUMENTS

| 7,994,705 | B2 | 8/2011 | Hosokawa |
| 9,806,279 | B2 | 10/2017 | Im et al. |
| 9,818,971 | B2 | 11/2017 | Cheng et al. |

(Continued)

FOREIGN PATENT DOCUMENTS

| KR | 10-2016-0006110 A | 1/2016 |
| KR | 10-2021-0016145 A | 2/2021 |
| KR | 10-2021-0038182 A | 4/2021 |

*Primary Examiner* — J. E. Schoenholtz
(74) *Attorney, Agent, or Firm* — Womble Bond Dickinson (US) LLP

(57) ABSTRACT

A display apparatus includes: an auxiliary line comprising a main sub-layer and an upper layer on the main sub-layer; an insulating layer comprising a first opening having a greater width than the auxiliary line, wherein the first opening overlaps the auxiliary line; a first electrode on the insulating layer; an intermediate layer overlapping the first electrode and comprising an emission layer; an auxiliary layer, at least a portion of which overlaps the auxiliary line; and a second electrode on the auxiliary layer, wherein the upper layer of the auxiliary line comprises a tip protruding, in a lateral direction, from a first point, in which a side surface and an upper surface of the main sub-layer meet each other, and being curved upwards from the first point, and the second electrode contacts the side surface of the main sub-layer through the first opening of the insulating layer.

20 Claims, 17 Drawing Sheets

(56) References Cited

U.S. PATENT DOCUMENTS

| | | | |
|---|---|---|---|
| 10,205,122 B2* | 2/2019 | Choi | H10K 50/844 |
| 10,483,336 B2 | 11/2019 | Lee et al. | |
| 11,444,140 B2* | 9/2022 | Seo | H10K 59/124 |
| 2016/0013438 A1* | 1/2016 | Im | H10K 59/80517 |
| | | | 257/762 |
| 2019/0173042 A1* | 6/2019 | Lim | H10K 59/8723 |
| 2020/0243627 A1* | 7/2020 | Lee | H10K 50/824 |
| 2021/0036073 A1 | 2/2021 | Cho et al. | |
| 2023/0209909 A1* | 6/2023 | Byun | H10K 50/844 |
| | | | 257/40 |
| 2024/0224639 A1* | 7/2024 | Yang | H10K 59/122 |

* cited by examiner

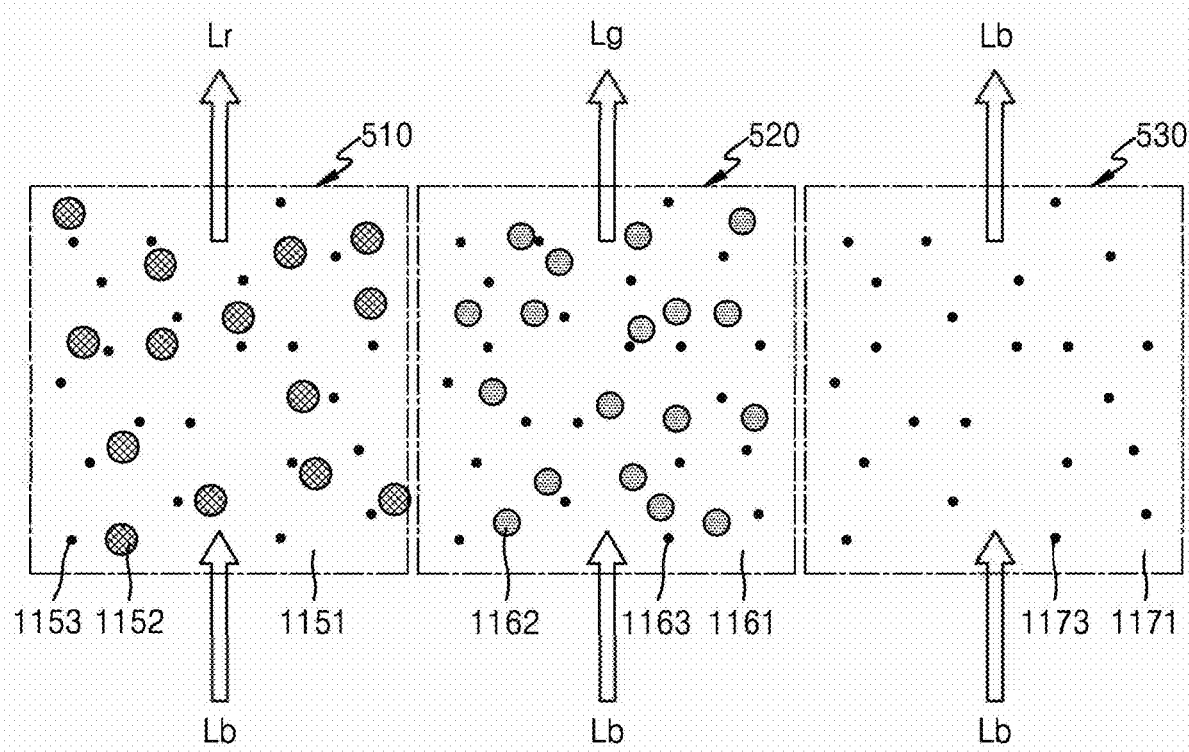

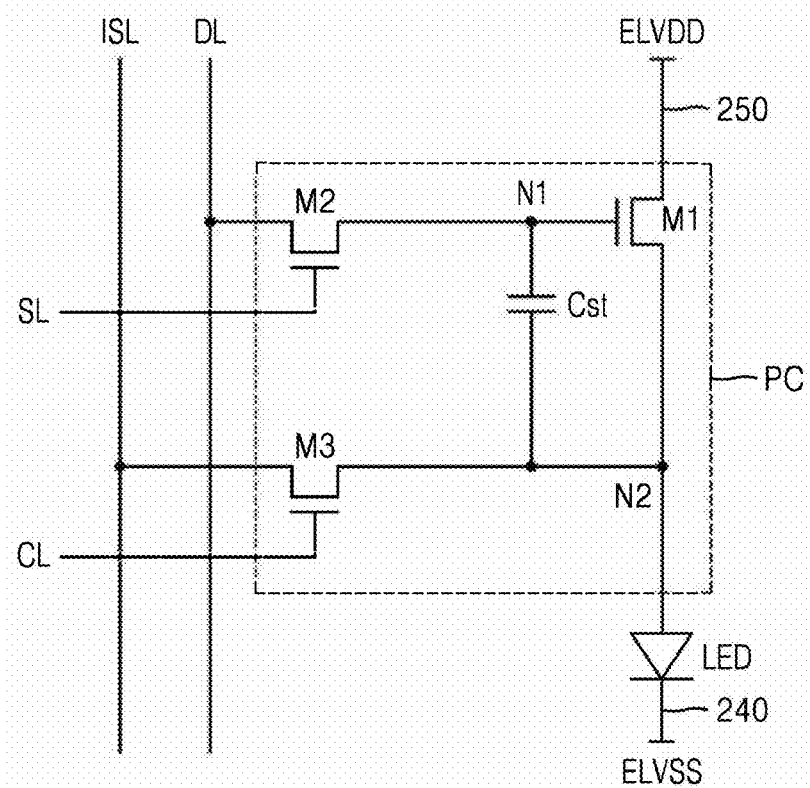

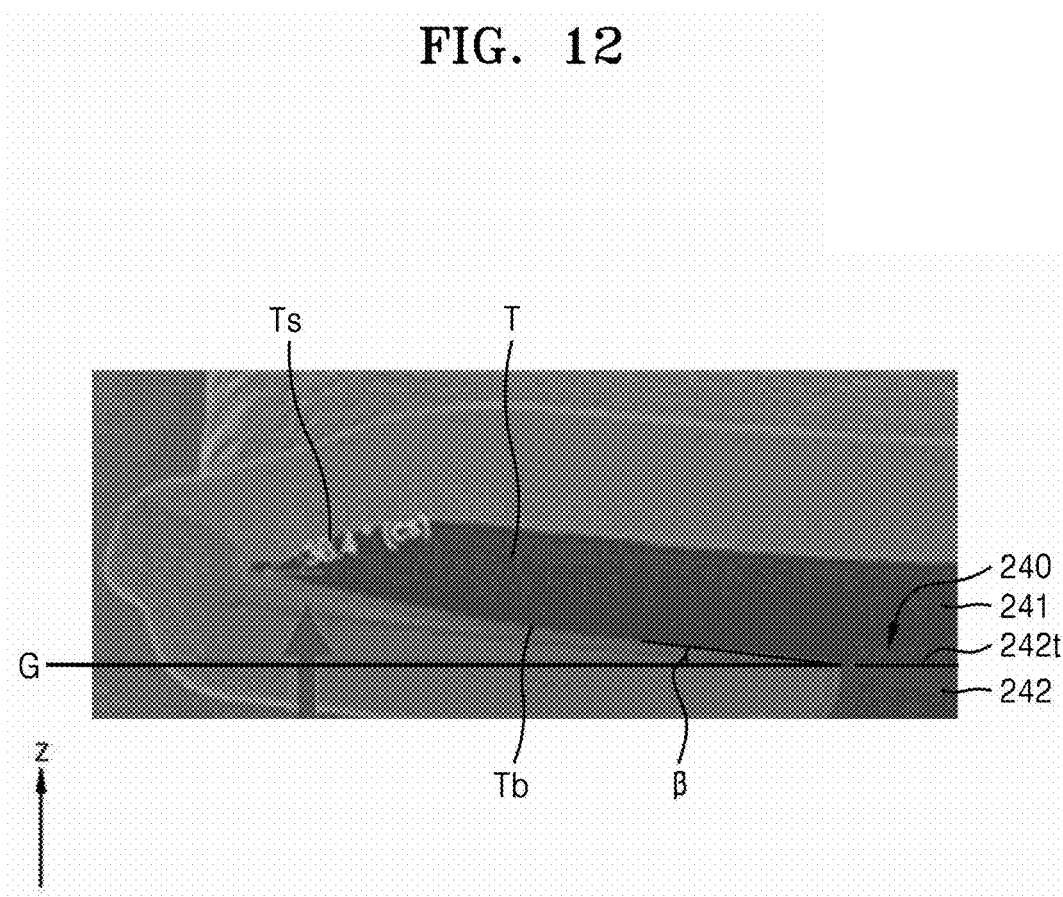

DISPLAY APPARATUS AND MANUFACTURING METHOD OF THE SAME

CROSS-REFERENCE TO RELATED APPLICATION

The present application claims priority to and the benefit of Korean Patent Application No. 10-2021-0145857, filed on Oct. 28, 2021, in the Korean Intellectual Property Office, the entire disclosure of which is incorporated herein by reference.

BACKGROUND

1. Field

Aspects of one or more embodiments relate to a display apparatus and a manufacturing method of the display apparatus.

2. Description of the Related Art

In general, in a display apparatus such as an organic light-emitting display apparatus, transistors are arranged in a display area to control the brightness, etc. of light-emitting diodes to display images. The transistors are configured to control corresponding light-emitting diodes to emit light of certain colors by using data signals, a driving voltage, and a common voltage.

An electrode of a light-emitting diode may receive a certain voltage from a transistor, and another electrode may receive a voltage through an auxiliary line.

The above information disclosed in this Background section is only for enhancement of understanding of the background and therefore the information discussed in this Background section does not necessarily constitute prior art.

SUMMARY

Aspects of one or more embodiments include a display apparatus capable of displaying relatively high-quality images. However, this is merely an example, and the scope of embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes an auxiliary line including a main sub-layer and an upper layer arranged on the main sub-layer, an insulating layer including a first opening having a greater width than the auxiliary line, wherein the first opening overlaps the auxiliary line, a first electrode on the insulating layer, an intermediate layer overlapping the first electrode and including an emission layer, an auxiliary layer, at least a portion of which overlaps the auxiliary line, and a second electrode on the auxiliary layer, wherein the upper layer of the auxiliary line includes a tip protruding, in a lateral direction, from a first point, in which a side surface and an upper surface of the main sub-layer meet each other, and being curved upwards from the first point, and the second electrode contacts the side surface of the main sub-layer through the first opening of the insulating layer.

According to some embodiments, the auxiliary layer may include a transparent conductive material.

According to some embodiments, the auxiliary layer may include a first portion on the upper layer of the auxiliary line and a second portion separated from the first portion by the tip.

According to some embodiments, the second portion of the auxiliary layer may contact the side surface of the main sub-layer.

According to some embodiments, the second electrode may include a different material from the auxiliary layer.

According to some embodiments, the main sub-layer may include at least one selected from among copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

According to some embodiments, the auxiliary line may further include a lower layer arranged under the main sub-layer, and a thickness of the main sub-layer may be greater than at least one of thicknesses of the upper layer or the lower layer.

According to some embodiments, at least one of the upper layer or the lower layer may include at least one of indium tin oxide (ITO), titanium (Ti), Mo, or tungsten (W).

According to some embodiments, the intermediate layer may overlap the first electrode and the auxiliary line, and a portion of the intermediate layer may be on the auxiliary line while separated, by the tip, from another portion of the intermediate layer around the auxiliary line.

According to some embodiments, the second electrode may overlap the first electrode and the auxiliary line, and a portion of the second electrode may be on the auxiliary line while separated, by the tip, from another portion of the second electrode around the auxiliary line.

According to one or more embodiments, a display apparatus includes an auxiliary line including a main sub-layer and an upper layer on the main sub-layer, an insulating layer including a first opening having a greater width than the auxiliary line, wherein the first opening overlaps the auxiliary line, a first electrode on the insulating layer, an intermediate layer overlapping the first electrode and including an emission layer, and a transparent conductive material layer overlapping the intermediate layer and the auxiliary line, wherein the upper layer of the auxiliary line includes a tip protruding, in a lateral direction, from a first point, in which a side surface and an upper surface of the main sub-layer meet each other, and curved upwards from the first point.

According to some embodiments, the transparent conductive material layer may include a first portion on the upper layer of the auxiliary line and a second portion separated from the first portion by the tip, wherein the second portion of the transparent conductive material layer directly contacts the side surface of the main sub-layer of the auxiliary line.

According to some embodiments, the display apparatus may further include a second electrode on the transparent conductive material layer.

According to some embodiments, the second electrode may include a different material from the transparent conductive material layer.

According to some embodiments, the auxiliary line may further include a lower layer arranged under the main sub-layer, and a thickness of the main sub-layer may be greater than at least one of thicknesses of the upper layer or the lower layer.

According to some embodiments, the transparent conductive material layer may include at least one selected from among indium tin oxide (ITO), gallium zinc oxide (GZO), and indium zinc oxide (IZO).

According to one or more embodiments, a manufacturing method of a display apparatus includes forming an auxiliary line including a main sub-layer and an upper layer on the main sub-layer, forming an insulating layer including a first opening having a greater width than the auxiliary line, wherein the first opening overlaps the auxiliary line, forming a first electrode on the insulating layer, forming an intermediate layer overlapping the first electrode and including an emission layer, forming a transparent conductive material layer overlapping the intermediate layer and the auxiliary line, and forming a second electrode on the transparent conductive material layer, wherein, in the forming of the second electrode on the transparent conductive material layer, the second electrode contacts a side surface of the main sub-layer of the auxiliary line, and the surface of the main sub-layer is located under a tip of the upper layer, the tip protruding, in a lateral direction, from a first point, in which the side surface and an upper surface of the main sub-layer meet each other, and curved upwards from the first point.

According to some embodiments, the transparent conductive material layer may be formed at a pressure equal to or greater than about 7 mTorr.

According to some embodiments, the second electrode may include a different material from the transparent conductive material layer.

According to some embodiments, the transparent conductive material layer may be formed through sputtering.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 3 illustrates each optical unit of a color conversion-penetration layer of FIG. 2 according to some embodiments;

FIG. 4 is an equivalent circuit diagram of a light-emitting diode and a sub-pixel circuit electrically connected to the light-emitting diode which are included in a display apparatus, according to some embodiments;

FIG. 12 is an image showing a shape of a portion of a display apparatus, according to some embodiments.

DETAILED DESCRIPTION

Figure 1:
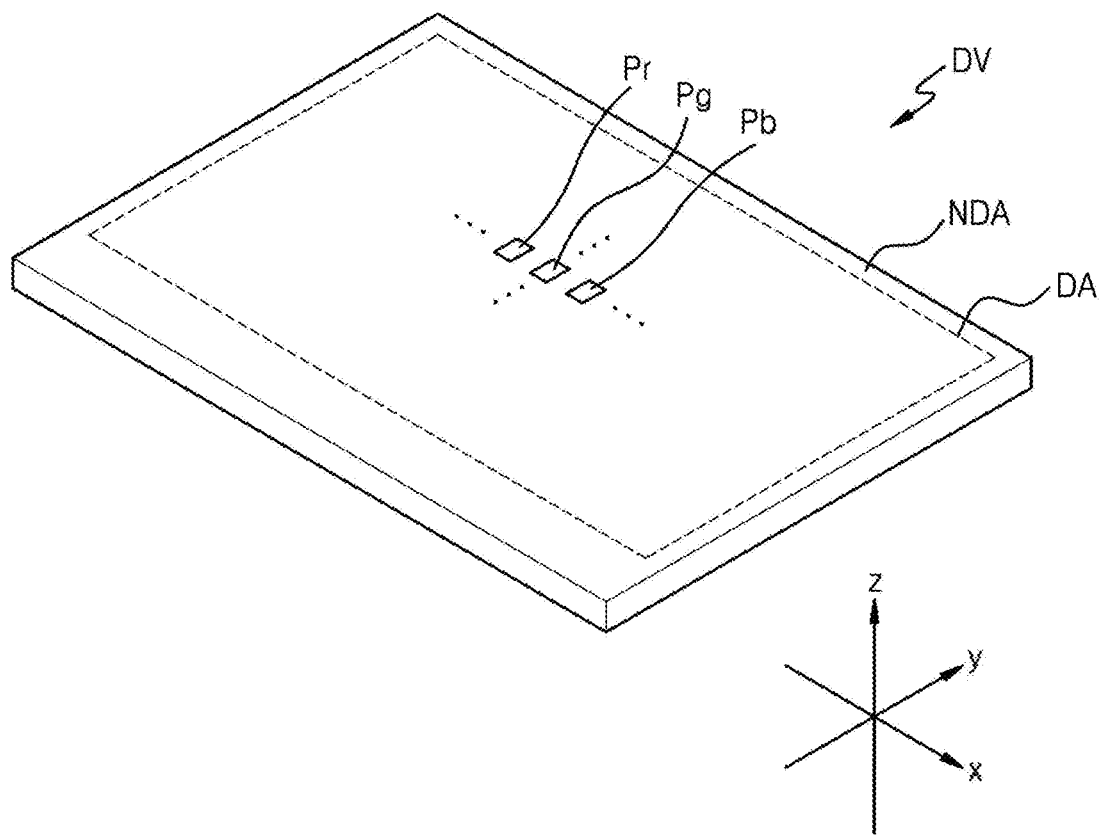
FIG. 1 is a schematic perspective view of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

One or more embodiments of the present disclosure will be described more fully with reference to the accompanying drawings, like reference numerals in the drawings denote like elements, and repeated descriptions thereof will not be provided.

While such terms as "first," "second," etc., may be used to describe various components, such components must not be limited to the above terms, and the above terms are used only to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being connected to another layer, region, or component, it can be directly or indirectly connected to the other layer, region, or component. For example, when a layer, region, or component is referred to as being electrically connected to another layer, region, or component, it can be directly or indirectly electrically connected to the other layer, region, or component.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the present disclosure is not limited thereto.

When a certain embodiment may be implemented differently, a specific process order may be performed differently from the described order. For example, two consecutively described processes may be performed substantially at the same time or performed in an order opposite to the described order.

FIG. 1 is a schematic perspective view of a display apparatus according to some embodiments.

Referring to FIG. 1, a display apparatus DV may include a display area DA and a non-display area NDA outside (e.g., in a periphery, or outside a footprint of) the display area DA. The display apparatus DV may provide or display images through an array of sub-pixels that are two-dimensionally arranged on an x-y plane in the display area DA. The sub-pixels may include first to third sub-pixels, and hereinafter, the first sub-pixel may be a red sub-pixel Pr, the second sub-pixel may be a green sub-pixel Pg, and the third sub-pixel may be a blue sub-pixel Pb for convenience of explanation.

The red sub-pixel Pr, the green sub-pixel Pg, and the blue sub-pixel Pb may be areas where red light, green light, and blue light may be emitted, respectively, and the display apparatus DV may provide an image by using light emitted from the sub-pixels.

The non-display area NDA may be an area where no images are displayed and may entirely surround the display area DA. In the non-display area NDA, drivers or main voltage lines configured to provide electrical signals or power to sub-pixel circuits may be arranged. In the non-display area NDA, a pad that may be electrically connected to an electronic component or a printed circuit board may be included.

The display area DA may have a polygonal shape including a rectangular shape, as illustrated in FIG. 1. For example, the display area DA may have a rectangular shape in which a horizontal length is greater than a vertical length or the horizontal length is less than the vertical length, or may have a square shape.

Alternatively, the display area DA may have various shapes such as an oval shape or a circular shape.

Figure 2:
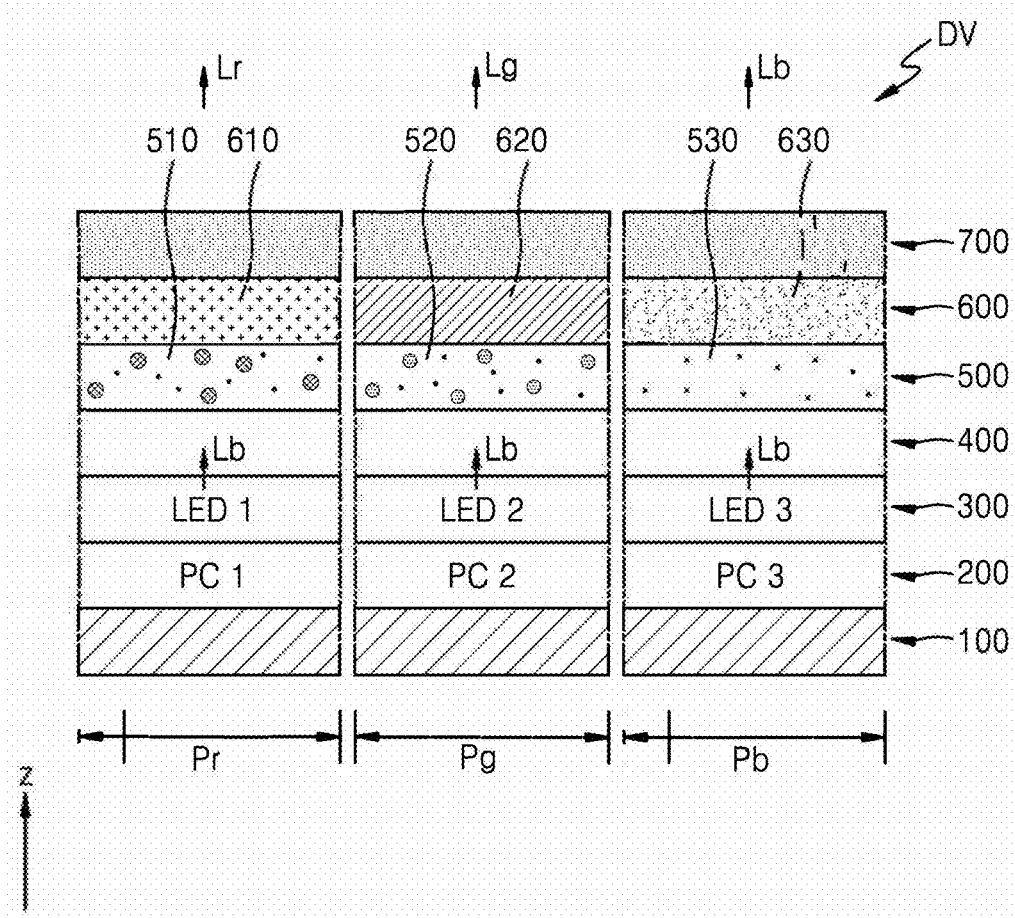
FIG. 2 is a schematic cross-sectional view of each sub-pixel of a display apparatus, according to some embodiments.

FIG. 2 is a schematic cross-sectional view of each sub-pixel of a display apparatus, according to some embodiments.

Referring to FIG. 2, the display apparatus DV may include a circuit layer 200 on a substrate 100. The circuit layer 200 may include first to third sub-pixel circuits PC1 to PC3, and the first to third sub-pixel circuits PC1 to PC3 may be electrically connected to first to third light-emitting diodes LED1 to LED3 of a light-emitting diode layer 300, respectively.

The first to third light-emitting diodes LED1 to LED3 may include organic light-emitting diodes including organic materials. According to some embodiments, the first to third light-emitting diodes LED1 to LED3 may be inorganic light-emitting diodes including inorganic materials. The inorganic light-emitting diodes may include a PN junction diode including materials based on an inorganic semiconductor. When a voltage is applied to the PN junction diode in a forward direction, electrons and holes may be injected, and energy generated from the recombination of the electrons and holes may be converted into light energy so that certain colors of light may be emitted. The inorganic light-emitting diodes described above may have a width of several to several hundreds of micrometers or several to several hundreds of nanometers. In some embodiments, the light-emitting diode LED may be a light-emitting diode including quantum dots. As described above, an emission layer of the light-emitting diode LED may include organic materials, inorganic materials, quantum dots, both organic materials and quantum dots, or both inorganic materials and quantum dots.

The first to third light-emitting diodes LED1 to LED3 may emit light having the same color. For example, light (e.g., blue light Lb) emitted from the first to third light-emitting diodes LED1 to LED3 may pass a color conversion-penetration layer 500 through an encapsulation layer 400 on the light-emitting diode layer 300.

The color conversion-penetration layer 500 may include optical units that transmit a color of the light (e.g., the blue light Lb) emitted from the light-emitting diode layer 300 with or without converting the color of the emitted light. For example, the color conversion-penetration layer 500 may include color converters configured to convert the light (e.g., the blue light Lb) from the light-emitting diode layer 300 into light of another color, and a penetration unit configured to transmit the light (e.g., the blue light Lb) emitted from the light-emitting diode layer 300 without converting the color of the emitted light. The color conversion-penetration layer 500 may include a first color converter 510 corresponding to the red sub-pixel Pr, a second color converter 520 corresponding to the green sub-pixel Pg, and a penetration unit 530 corresponding to the blue sub-pixel Pb. The first color converter 510 may convert the blue light Lb into red light Lr, and the second color converter 520 may convert the blue light Lb into green light Lg. The penetration unit 530 may transmit the blue light Lb without conversion.

A color layer 600 may be on the color conversion-penetration layer 500. The color layer 600 may include first to third color filters 610 to 630 having different colors. For example, the first color filter 610 may be a red color filter, the second color filter 620 may be a green color filter, and the third color filter 630 may be a blue color filter.

The light, the color of which is converted and transmitted by the color conversion-penetration layer 500, may pass through the first to third color filters 610 to 630 and may have improved color purity. Also, the color layer 600 may prevent or reduce external light (e.g., light that is incident towards the display apparatus DV from the outside thereof) from being reflected and viewed by users.

A light-transmissive substrate layer 700 may be on the color layer 600. The light-transmissive substrate layer 700 may include glass or a light-transmissive organic material. For example, the light-transmissive substrate layer 700 may include a light-transmissive organic material such as acryl-based resin.

According to some embodiments, the light-transmissive substrate layer 700 is sort of a substrate, and after the color layer 600 and the color conversion-penetration layer 500 are formed on the light-transmissive substrate layer 700, the color conversion-penetration layer 500 may be integrated with the encapsulation layer 400 to face the encapsulation layer 400.

According to some embodiments, after the color conversion-penetration layer 500 and the color layer 600 are sequentially formed on the encapsulation layer 400, the light-transmissive substrate layer 700 may be formed on the color layer 600 through the direct spreading and hardening of the light-transmissive substrate layer 700. According to some embodiments, other optical films such as an anti-reflection film may be arranged on the light-transmissive substrate layer 700.

The display apparatus DV having the above structure may include an electronic device, for example, a television, a billboard, a projection screen, a monitor, a tablet personal computer (PC), or a laptop, which may display moving or still images.

FIG. 3 illustrates each optical unit of a color conversion-penetration layer of FIG. 2.

Referring to FIG. 3, the first color converter 510 may convert the incident blue light Lb into the red light Lr. As illustrated in FIG. 3, the first color converter 510 may include a first photosensitive polymer 1151 and first quantum dots 1152 and first scattered particles 1153 that are spread on the first photosensitive polymer 1151.

The first quantum dots 1152 may be excited by the blue light Lb and isotropically emit the red light Lr having a greater wavelength than the blue light Lb. The first photosensitive polymer 1151 may include an organic material that is light-transmissive. The first scattered particles 1153 may increase the color conversion efficiency by scattering the blue light Lb, which has not yet been absorbed into the first quantum dots 1152, to make more first quantum dots 1152 be excited. The first scattered particles 1153 may be, for example, titanium oxide ($TiO_2$) or metal particles. The first quantum dots 1152 may be selected from among II-VI group compounds, III-V group compounds, IV-VI group compounds, IV group elements, IV group compounds, and a combination thereof.

The second color converter 520 may convert the incident blue light Lb into the green light Lg. As illustrated in FIG. 3, the second color converter 520 may include a second photosensitive polymer 1161, second quantum dots 1162 and second scattered particles 1163 that are spread on the second photosensitive polymer 1161.

The second quantum dots 1162 may be excited by the blue light Lb and isotropically emit the green light Lg having a greater wavelength than the blue light Lb.

The second photosensitive polymer 1161 may include an organic material that is light-transmissive.

The second scattered particles 1163 may increase the color conversion efficiency by scattering the blue light Lb, which has not yet been absorbed into the second quantum dots 1162, to make more second quantum dots 1162 be excited. The second scattered particles 1163 may be, for example, $TiO_2$ or metal particles. The second quantum dots 1162 may be selected from among II-VI group compounds, III-V group compounds, IV-VI group compounds, IV group elements, IV group compounds, and a combination thereof.

The penetration unit 530 may transmit the blue light Lb without converting the blue light Lb incident on the penetration unit 530. As illustrated in FIG. 3, the penetration unit 530 may include a third photosensitive polymer 1171 on which third scattered particles 1173 are spread. The third photosensitive polymer 1171 may include an organic material, for example, silicon resin or epoxy resin, which is light-transmissive and may include the same material as the first and second photosensitive polymers 1151 and 1161. The third scattered particles 1173 may scatter and emit the blue light Lb and include the same material as the first and second scattered particles 1153 and 1163.

FIG. 4 is an equivalent circuit diagram of a light-emitting diode and a sub-pixel circuit electrically connected to the light-emitting diode which are included in a display apparatus, according to some embodiments. The sub-pixel circuit PC of FIG. 4 corresponds to each of the first to third sub-pixel circuits PC1 to PC3 described above with reference to FIG. 2, and the light-emitting diodes LED of FIG. 4 may respectively correspond to the first to third light-emitting diodes LED1 to LED3 described above with reference to FIG. 2.

Referring to FIG. 4, a first electrode (e.g., an anode) of a light-emitting diode, e.g., the light-emitting diode LED, may be connected to the sub-pixel circuit PC, and a second electrode (e.g., a cathode) of the light-emitting diode LED may be connected to an auxiliary line 240 configured to provide a common voltage ELVSS. The light-emitting diode LED may emit light at a brightness corresponding to the amount of current provided from the sub-pixel circuit PC.

The light-emitting diode LED of FIG. 4 may correspond to each of the first to third light-emitting diodes LED1 to LED3 described above with reference to FIG. 2, and the sub-pixel circuit PC of FIG. 4 may correspond to each of the first to third sub-pixel circuits PC1 to PC3 described above with reference to FIG. 2.

The sub-pixel circuit PC may control the amount of current flowing to the common voltage ELVSS from a driving voltage ELVDD via the light-emitting diode LED, in response to a data signal. The sub-pixel circuit PC may include a first transistor M1, a second transistor M2, a third transistor M3, and a storage capacitor Cst.

Each of the first to third transistors M1 to M3 may be an oxide semiconductor transistor including a semiconductor layer including an oxide semiconductor, or a silicon semiconductor transistor including a semiconductor layer including polysilicon. According to a transistor type, a first electrode may be one of a source electrode and a drain electrode, and a second electrode may be the other thereof.

A first electrode of the first transistor M1 may be connected to a driving voltage line 250 configured to provide the driving voltage ELVDD, and a second electrode of the first transistor M1 may be connected to the first electrode of the light-emitting diode LED. A gate electrode of the first transistor M1 may be connected to a first node N1. The first transistor M1 may be configured to control the amount of current flowing in the light-emitting diode LED from the driving voltage ELVDD, according to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. The second transistor M2 may be turned on when a scan signal is provided to the scan line SL and may electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to a sensing line ISL. A gate electrode of the third transistor M3 may be connected to a control line CL.

The storage capacitor Cst may be connected between the first and second nodes N1 and N2. For example, a first capacitor electrode of the storage capacitor Cst may be connected to the gate electrode of the first transistor M1, and a second capacitor electrode of the storage capacitor Cst may be connected to a first electrode of the light-emitting diode LED.

FIG. 4 illustrates that the first to third transistors M1 to M3 each are an NMOS transistors, but embodiments according to the present disclosure are not limited thereto. For example, at least one of the first to third transistors M1 to M3 may be a PMOS transistor.

FIG. 4 illustrates three transistors, but embodiments according to the present disclosure are not limited thereto. The sub-pixel circuit PC may include four or more transistors. Thus, the sub-pixel circuit PC according to some embodiments may include additional electrical components or fewer electrical components without departing from the spirit and scope of embodiments according to the present disclosure.

Figure 5A:
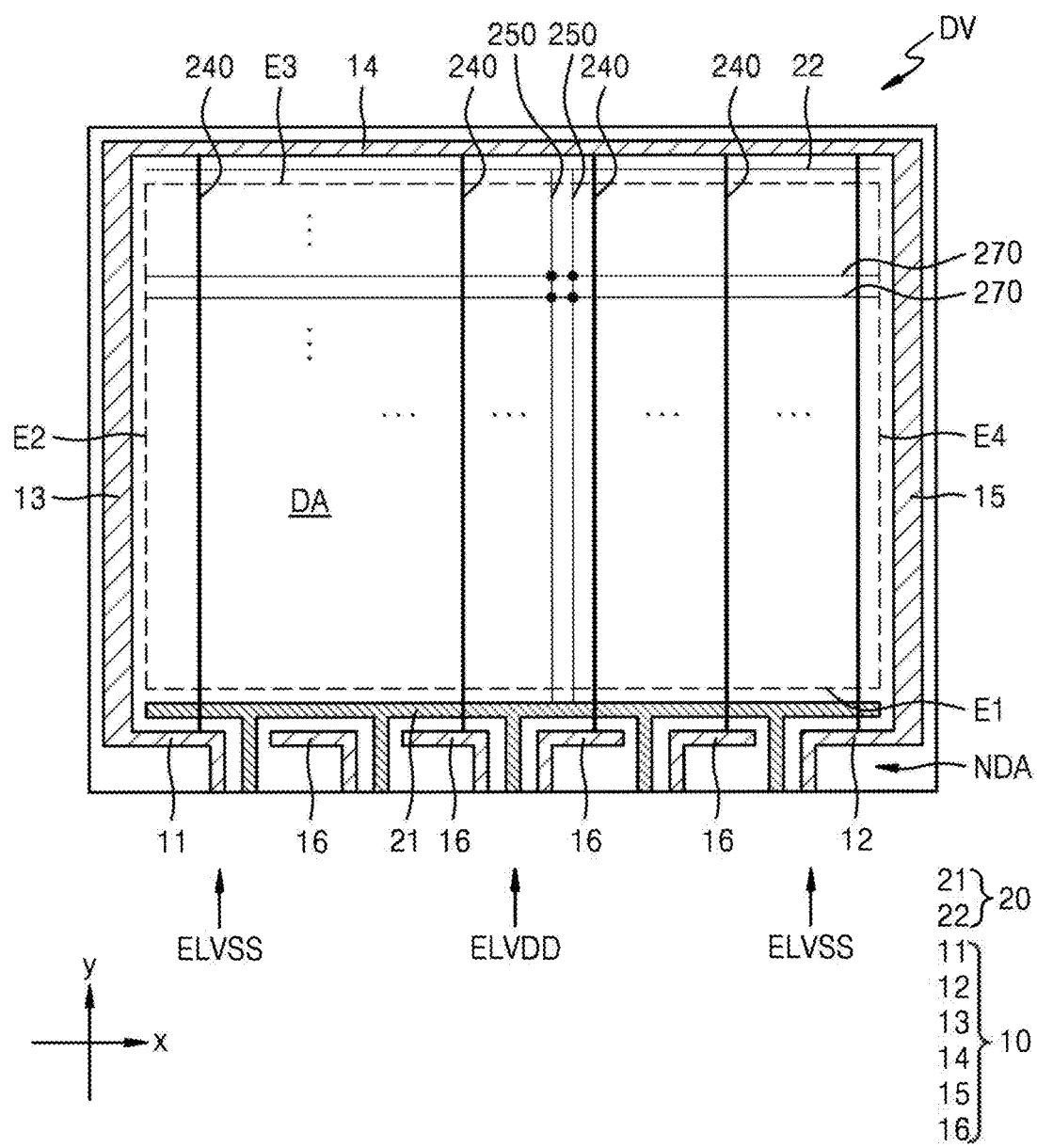
FIG. 5A is a plan view of a common voltage supply line and a driving voltage supply line of a display apparatus, according to some embodiments.

FIG. 5A is a plan view of a common voltage supply line and a driving voltage supply line of a display apparatus, according to some embodiments.

Referring to FIG. 5A, the display apparatus DV may include a common voltage supply line 10 configured to provide the common voltage ELVSS to the sub-pixel circuit PC described above with reference to FIG. 4 and a driving voltage supply line 20 configured to provide the driving voltage ELVDD to the second electrode of the light-emitting diode. The common voltage supply line 10 and the driving voltage supply line 20 may be arranged in the non-display area NDA.

A shape of the display apparatus DV may be substantially the same as a shape of the substrate 100. For example, it may be stated that the substrate 100 includes the display area DA and the non-display area NDA on an outer side of the display area DA, and hereinafter, it will be described that the substrate 100 includes the display area DA and the non-display area NDA on the outer side of the display area DA for convenience of explanation.

The common voltage supply line 10 may include a first common voltage input portion 11 and a second common voltage input portion 12 that are adjacent to a first edge E1 of the display area DA. The first common voltage input portion 11 and the second common voltage input portion 12 may be apart from each other in an x direction, but may be integrally connected to each other through first to third extension portions 13 to 15 that are adjacent to second to fourth edges E2 to E4 of the display area DA.

At least one third common voltage input portion 16 may be located between the first common voltage input portion 11 and the second common voltage input portion 12, and according to some embodiments, FIG. 5A illustrates four third common voltage input portions 16.

The common voltage supply line 10 may be electrically connected to the auxiliary lines 240 passing the display area DA. Each of the auxiliary lines 240 may extend, for example, in a y direction, as illustrated in FIG. 5A. At least one auxiliary line 240 may extend to cross the display area DA in the y direction and may be electrically connected to part of the first common voltage input portion 11 and the second extension portion 14 facing the first common voltage input portion 11. At least another auxiliary line 240 may extend to cross the display area DA in the y direction and may be electrically connected to part of the second common voltage input portion 12 and the second extension portion 14 facing the second common voltage input portion 12. Similarly, at least another auxiliary line 240 may extend to cross the display area DA in the y direction and may be electrically connected to part of the third common voltage input portion 16 and the second extension portion 14 facing the third common voltage input portion 16.

When the common voltage supply line 10 includes the third common voltage input portion 16 arranged between the first common voltage input portion 11 and the second common voltage input portion 12, the current density may decrease and the heat emission may be restricted when a current supplied through the common voltage supply line 10 is applied, compared to when the common voltage supply line 10 only includes the first common voltage input portion 11 and the second common voltage input portion 12.

The driving voltage supply line 20 may be arranged in the non-display area NDA and include a driving voltage supply portion 21 adjacent to the first edge E1 of the display area DA and a counterpart 22 extending along the third edge E3 of the display area DA. The driving voltage supply portion 21 and the counterpart 22 may be arranged on both sides of the display area DA with the display area DA therebetween.

The driving voltage supply line 20 may be electrically connected to driving voltage lines 250 crossing the display area DA. Each driving voltage line 250 may extend in the y direction while being electrically connected to the driving voltage supply portion 21. In some embodiments, the driving voltage lines 250 may be electrically connected to horizontal driving voltage lines 270 extending in the x direction to cross the driving voltage lines 250. The driving voltage lines 250 and the horizontal driving voltage lines 270 may be at different levels and electrically connected to each other through a contact hole penetrating at least one insulating layer.

Figure 5B:
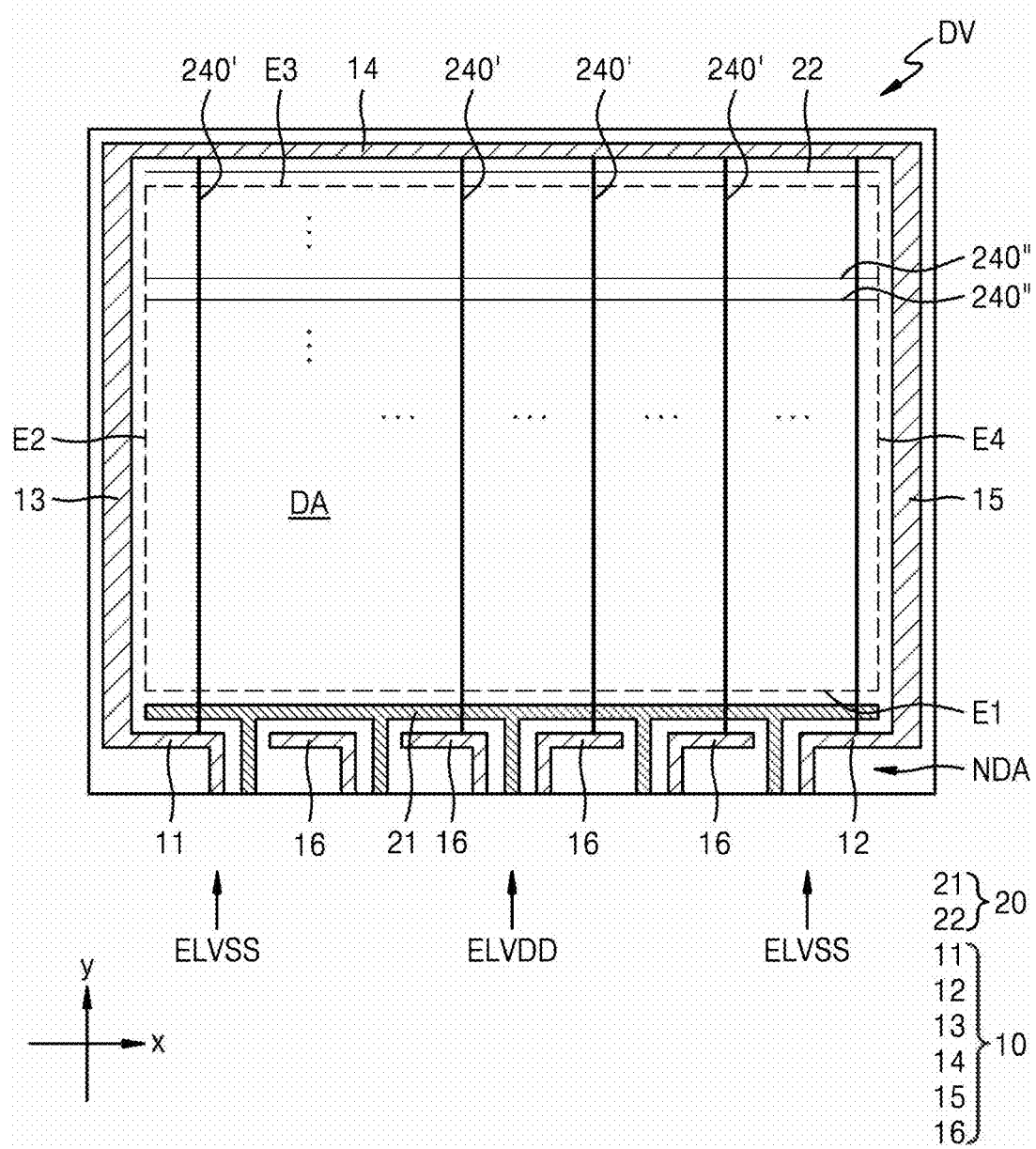
FIGS. 5B and 5C are plan views respectively illustrating a common voltage supply line of a display apparatus, according to some embodiments.
Figure 5C:
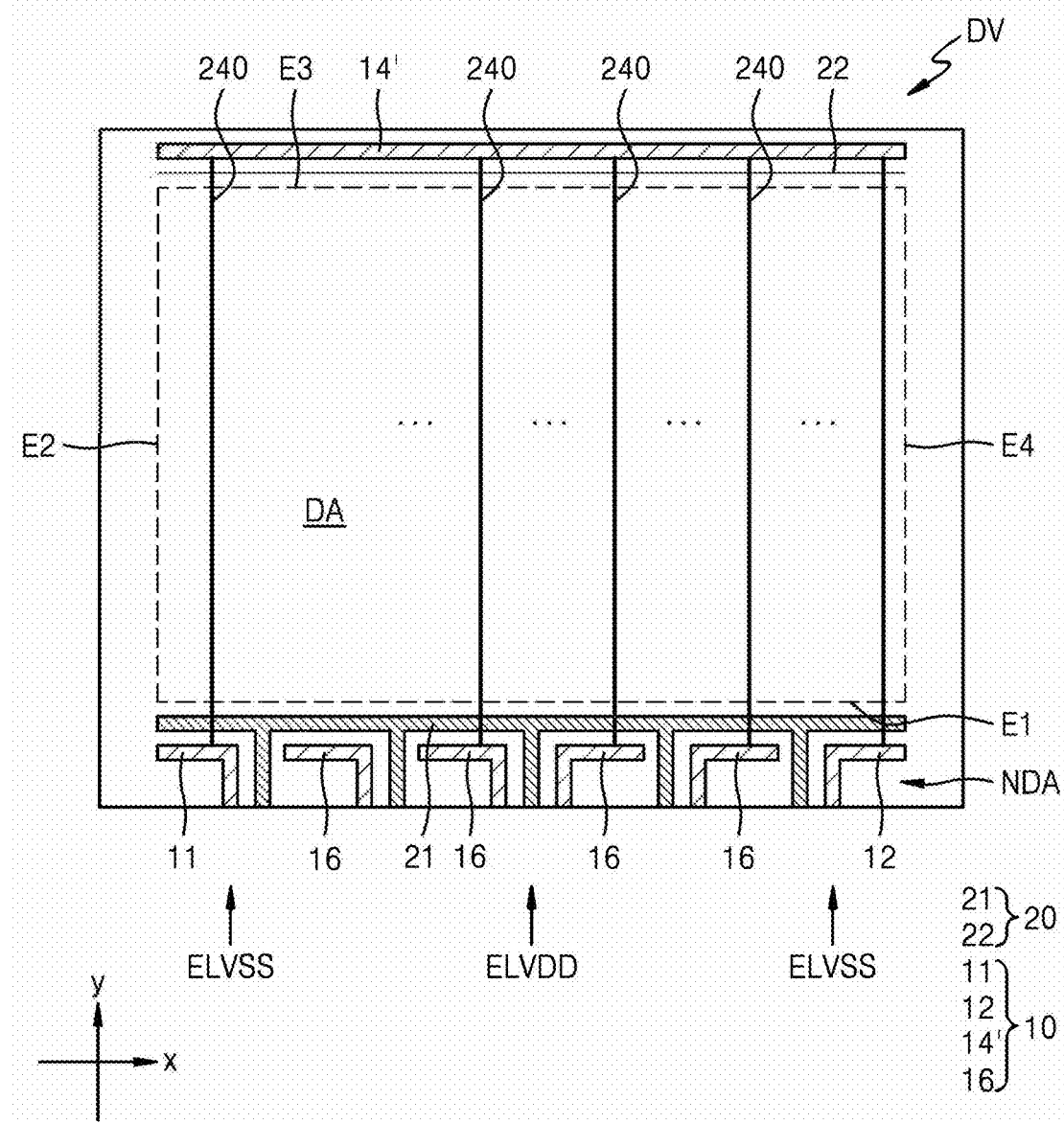

FIGS. 5B and 5C are plan views respectively illustrating a common voltage supply line of a display apparatus, according to some embodiments. As described above with reference to FIG. 5A, the display apparatus DV of FIGS. 5B and 5C includes the driving voltage line (250 of FIG. 5A) and the horizontal driving voltage line (270 of FIG. 5A) electrically connected to the driving voltage supply line 20, but for convenience of explanation, FIGS. 5B and 5C do not illustrate the driving voltage line (250 of FIG. 5A) and the horizontal driving voltage line (270 of FIG. 5A).

Referring to FIG. 5B, the display apparatus DV may include first auxiliary lines 240' (hereinafter, referred to as first auxiliary lines) crossing the display area DA in the y direction and auxiliary lines 240" (hereinafter, referred to as second auxiliary lines) crossing the display area DA in the x direction. The first auxiliary line 240' and the second auxiliary line 240" crossing each other may be at different levels and may be electrically connected to each other through a contact hole formed in at least any one insulating layer located between the first auxiliary line 240' and the second auxiliary line 240".

FIGS. 5A and 5B illustrate that the first common voltage input portion 11 and the second common voltage input portion 12 of the common voltage supply line 10 are integrally connected to each other through the first to third extension portions 13, 14, and 15, but one or more embodiments are not limited thereto.

According to some embodiments, as illustrated in FIG. 5C, the common voltage supply line 10 may include the first common voltage input portion 11 and the second common voltage input portion 12, which are adjacent to the first edge E1 of the display area DA, and an extension portion 14' that is adjacent to the third edge E3 of the display area DA. The extension portion 14' may be physically separated or spaced apart from the first common voltage input portion 11 and the second common voltage input portion 12.

End portions of the auxiliary lines 240 may be electrically connected to the first, second, and third common voltage input portions 11, 12, and 16, respectively, and the other end portions thereof may be connected to the extension portion 14'. In other words, because the first, second, and third common voltage input portions 11, 12, and 16 and the extension portion 14' are electrically connected by the auxiliary lines 240 crossing the display area DA, the first and third extension portions 13 and 15 may be omitted as illustrated above in FIGS. 5A and 5B. By omitting the first and third extension portions 13 and 15, a portion of the non-display area NDA (e.g., a portion of the non-display area NDA adjacent to the second and fourth edges E2 and E4 of the display area DA) may decrease.

Figure 6:
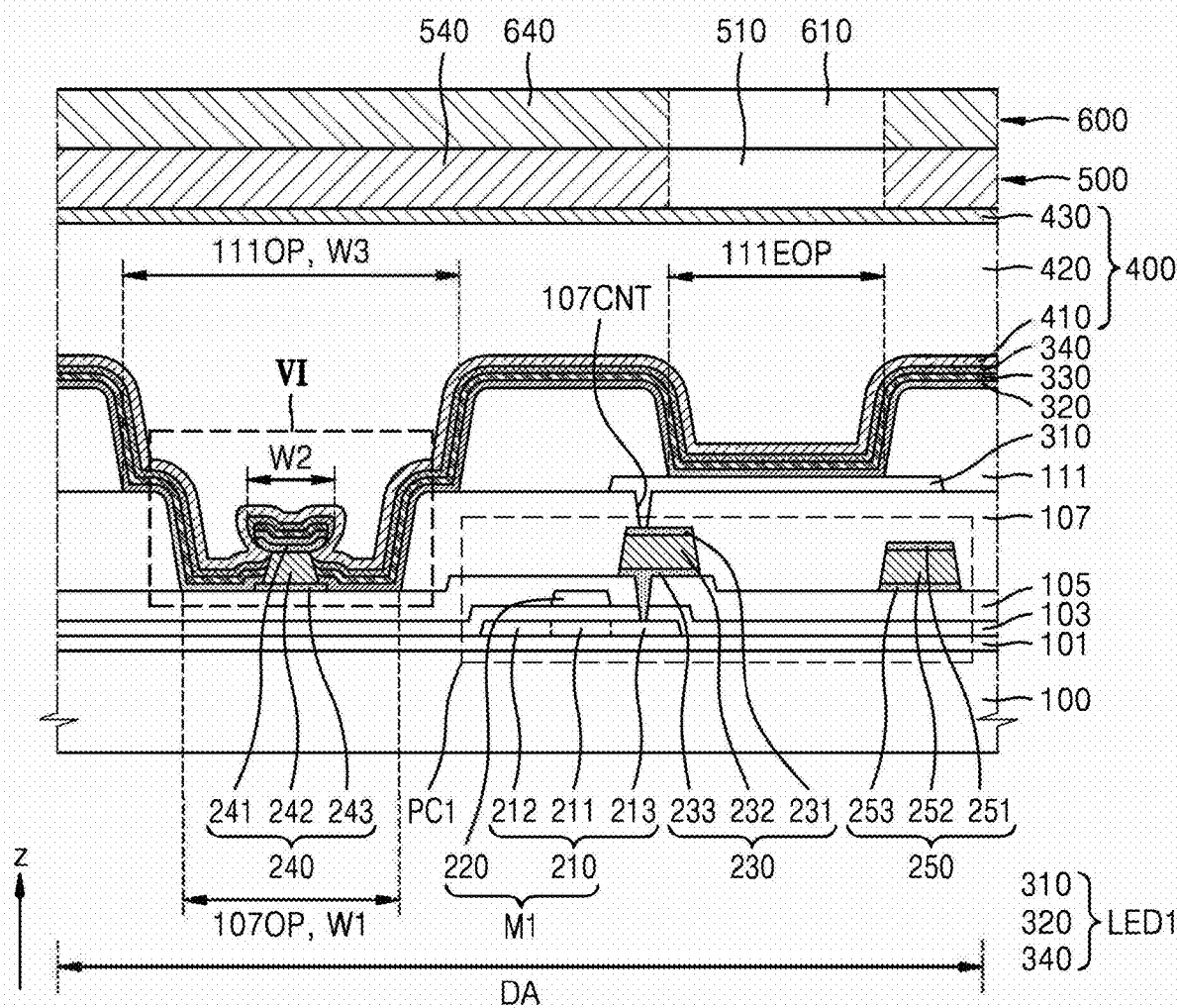
FIG. 6 is a cross-sectional view of a portion of a display apparatus, according to some embodiments.
Figure 7:
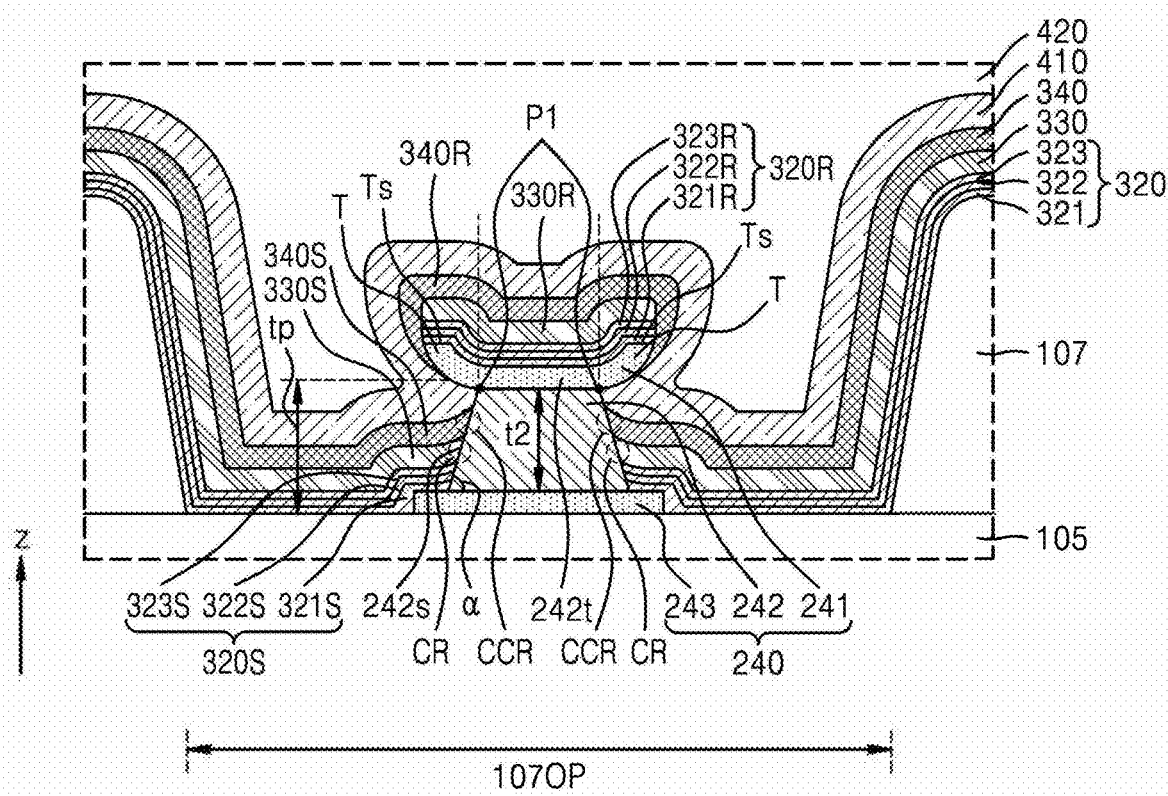
FIG. 7 is a cross-sectional view illustrating an enlarged region VI of FIG. 6 according to some embodiments.

FIG. 6 is a cross-sectional view of a portion of a display apparatus, according to some embodiments, and FIG. 7 is a cross-sectional view illustrating an enlarged region VI of FIG. 6.

Referring to FIG. 6, at least one of the auxiliary lines 240, the first auxiliary lines 240', or the second auxiliary lines 240" described above with reference to FIGS. 5A to 5C may be electrically connected to the second electrode of the light-emitting diode in the display area DA. Hereinafter, for convenience of explanation, it is illustrated that the auxiliary line 240 of FIG. 5A or 5C is electrically connected to the second electrode of the light-emitting diode LED, but the first auxiliary lines 240' and/or the second auxiliary lines 240" of FIG. 5B may also be electrically connected to the second electrode of the light-emitting diode LED. In other words, the auxiliary line 240 of FIG. 6 may be the first auxiliary line 240' and/or the second auxiliary line 240" described with reference to FIG. 5B.

FIG. 6 illustrates the first light-emitting diode LED1 among light-emitting diodes arranged in the display apparatus, but the second and third light-emitting diodes (LED2 and LED3 of FIG. 2) described above with reference to FIG. 2 may also have the same structure as the first light-emitting diode LED1 of FIG. 6.

Referring to FIG. 6, the first light-emitting diode LED1 is arranged on the substrate 100. The first sub-pixel circuit PC1 electrically connected to the first light-emitting diode LED1 is arranged between the substrate 100 and the first light-emitting diode LED1. As described above with reference to FIG. 4, the first sub-pixel circuit PC1 may include transistors and a storage capacitor. FIG. 6 illustrates the first transistor M1.

The substrate 100 may include a glass material or polymer resin. For example, the polymer resin may include polyether sulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may have flexibility. The shape of the display apparatus including the substrate 100 having the flexibility may change, for example, may be curved, bendable, rollable, or foldable.

A buffer layer 101 may be arranged on the substrate 100, prevent impurities from penetrating into a transistor, for example, the first transistor M1, from the substrate 100, and provide a flat surface on the substrate 100. The buffer layer 101 may include inorganic insulating materials such as silicon oxide, silicon nitride, and/or silicon oxynitride.

A driving semiconductor layer 210 of the first transistor M1 is arranged on the buffer layer 101. The driving semiconductor layer 210 may include an oxide semiconductor. The oxide semiconductor may include Indium Gallium Zinc Oxide (IGZO), Zinc Tin Oxide (ZTO), Indium Zinc Oxide (IZO), or the like. According to some embodiments, the driving semiconductor layer 210 may include polysilicon, amorphous silicon, an organic semiconductor, or the like. The driving semiconductor layer 210 may include a channel area 211 overlapping a driving gate electrode 220 and first and second areas 212 and 213 arranged on both sides of the channel area 211 and doped with impurities or being conductive. Any one of the first and second areas 212 and 213 may be a source area, and the other thereof may be a drain area.

The driving gate electrode 220 may overlap the channel area 211 of the semiconductor layer 210 with a gate insulating layer 103 therebetween. The driving gate electrode 220 may include a conductive material including molybdenum (Mo), aluminum (Al), copper (Cu), or titanium (Ti) and may be a layer or layers including the above material. The gate insulating layer 103 may include inorganic insulating materials such as silicon oxide, silicon nitride, and/or silicon oxynitride.

A connection electrode 230 may be on an interlayer insulating layer 105 and connected to any one of the first area 212 and the second area 213 of the semiconductor layer 210. FIG. 6 illustrates that the connection electrode 230 is connected to the second area 213. When the second area 213 is a source (or drain) area, the connection electrode 230 may correspond to a source (or drain) electrode. The interlayer insulating layer 105 may include inorganic insulating materials such as silicon oxide, silicon nitride, and/or silicon oxynitride.

The gate insulating layer 103 and the interlayer insulating layer 105 each are an insulating layer including an inorganic insulating material and may be formed through Chemical Vapor Deposition (CVD) or Atomic Layer Deposition (ALD).

The driving voltage line 250 may be on the interlayer insulating layer 105 and formed through the same process as the connection electrode 230. The connection electrode 230 and the driving voltage line 250 may each include a plurality of sub-layers. For example, the connection electrode 230 may include a first layer 231, a second layer 232 under the first layer 231, and a third layer 233 under the second layer 232. Similarly, the driving voltage line 250 may include a first layer 251, a second layer 252 under the first layer 251, and a third layer 253 under the second layer 252.

The auxiliary line 240 in the display area DA may be adjacent to the first sub-pixel circuit PC1. The auxiliary line 240 may be on the same layer as the connection electrode 230 and/or the driving voltage line 250. FIG. 6 illustrates that the auxiliary line 240 is arranged on the interlayer insulating layer 105.

The auxiliary line 240 may have a stack structure of multiple conductive layers. The auxiliary line 240 may include a main sub-layer 242, an upper layer 241 on the main sub-layer 242, and a lower layer 243 under the main sub-layer 242.

Referring to FIGS. 6 and 7, the main sub-layer 242 may be a sub-layer occupying most of the auxiliary line 240. The description that the main sub-layer 242 occupies most of the auxiliary line 240 may indicate that a thickness t2 of the main sub-layer 242 is greater than or equal to about 50% of the entire thickness tp of the auxiliary line 240 with respect to a center portion of the auxiliary line 240. In some embodiments, the thickness t2 of the main sub-layer 242 may be equal to or greater than about 60% or 70% of the entire thickness tp of the auxiliary line 240 with respect to the center portion of the auxiliary line 240. The thickness t2 of the main sub-layer 242 may be greater than a thickness of each of the upper layer 241 and the lower layer 243. According to some embodiments, the thickness t2 of the main sub-layer 242 may be between about 1000 Å and about 15000 Å.

The main sub-layer 242 may include a conductive material such as Cu, Al, platinum (Pt), palladium (Pd), silver (Ag), magnesium (Mg), gold (Au), nickel (Ni), neodymium (Nd), iridium (Ir), chromium (Cr), lithium (Li), calcium (Ca), and/or Mo by considering conductivity, etc. The main sub-layer 242 may have a single-layer structure or a multilayered structure including the above materials. In some embodiments, the main sub-layer 242 may be a layer including Cu or Al.

The lower layer 243 may include a different material from the main sub-layer 242. The lower layer 243 may be selected by considering conductivity, adhesion, and the like. For example, the lower layer 243 may be a metal layer including metal such as Ti, Mo, and/or tungsten (VV) and include Transparent Conductive Oxide (TCO) such as ITO, Gallium zinc oxide (GZO), and/or IZO, and the TCO may be amorphous or crystalline.

The upper layer 241 may be on the main sub-layer 242 and include a different material from the main sub-layer 242. The upper layer 241 may prevent the main sub-layer 242 from being damaged while the display apparatus is manufactured. The upper layer 241 may include TCO such as ITO. The upper layer 241 may include metal such as Ti, Mo, and/or W. Alternatively, the upper layer 241 may have a multilayered structure including the above metal layer and a TCO layer.

The connection electrode 230 and the driving voltage line 250 arranged on the same layer as the auxiliary line 240 may include the same material as the auxiliary line 240. For example, the first to third layers 231, 232, and 233 of the connection electrode 230 may include the same materials as the upper layer 241, the main sub-layer 242, and the lower layer 243 of the auxiliary line 240, respectively. Similarly, the first to third layers 251, 252, and 253 of the driving voltage line 250 may include the same materials as the upper layer 241, the main sub-layer 242, and the lower layer 243 of the auxiliary line 240, respectively.

A planarization insulating layer 107 may be on the connection electrode 230, the auxiliary line 240, and the driving voltage line 250. The planarization insulating layer 107 may include organic insulating materials such as acryl, benzocyclobutene (BCB), polyimide, and/or hexamethyldisiloxane (HMDSO).

The planarization insulating layer 107 includes a first opening 107OP overlapping the auxiliary line 240. A first width W1 of the first opening 107OP may be greater than a second width W2 of the auxiliary line 240, and thus, a portion of an upper surface of an insulating layer under the auxiliary line 240, for example, the interlayer insulating layer 105, may be exposed through the first opening 107OP.

A first electrode 310 on the planarization insulating layer 107 may be electrically connected to the first sub-pixel circuit PC1 through a contact hole 107CNT. For example, as illustrated in FIG. 6, the first electrode 310 may be connected to the connection electrode 230 through the contact hole 107CNT.

The first electrode 310 may be a (semi-)light-transmissive electrode or a reflection electrode. In some embodiments, the first electrode 310 may include a reflection layer including Ag, Mg, Al, Pt, Pd, Au, Ni, Nd, Ir, Cr, or a combination thereof. In some embodiments, the first electrode 310 may be a transparent or translucent electrode layer formed on the reflection layer. The transparent or translucent electrode layer may include TCO such as ITO, IZO, ZnO, $In_2O_3$, IGO, or AZO. In some embodiments, the first electrode 310 may be a three-layer structure including an ITO layer, an Ag layer, and an ITO layer.

A bank layer 111 may be on the first electrode 310 and cover an edge of the first electrode 310. The bank layer 111 includes an opening (hereinafter, an emission opening 111EOP) overlapping a portion of the first electrode 310. The emission opening 111EOP may expose a center portion of the first electrode 310. The bank layer 111 may include an organic material. The bank layer 111 may include a second opening 111OP overlapping a first opening 107OP of the planarization insulating layer 107. A third width W3 of the second opening 111OP may be greater than the first width W1 of the first opening 107OP.

An intermediate layer 320 may contact the first electrode 310 through the emission opening 111EOP. As illustrated in FIG. 7, the intermediate layer 320 may include an emission layer 322 and functional layers located under and/or on the emission layer 322. FIG. 7 illustrates that the intermediate layer 320 includes a first functional layer 321 arranged under the emission layer 322 and a second functional layer 323 arranged on the emission layer 322.

The first functional layer 321 may be a layer or layers. The first functional layer 321 may include a Hole Injection Layer (HIL) and/or a Hole Transport Layer (HTL). The emission layer 322 may include a high-molecular-weight or low-molecular-weight organic material emitting a certain color of light. The second functional layer 323 may include an Electron Transport Layer (ETL) and/or an Electron Injection Layer (EIL).

An auxiliary layer 330 may be on the intermediate layer 320, and a portion of the auxiliary layer 330 may overlap the auxiliary line 240. The auxiliary layer 330 may include a transparent conductive material. For example, the auxiliary layer 330 may include TCO such as ITO, GZO, and/or IZO, and the above TCO may be amorphous or crystalline.

A second electrode 340 may be on the auxiliary layer 330. The second electrode 340 may be a (semi-)light-transmissive electrode or a reflection electrode. In some embodiments, the second electrode 340 may be a transparent or translucent electrode and may include a conductive material having a low work function. For example, the second electrode 340 may include a transparent (or translucent) layer including Ag, Mg, Al, Pt, Pd, Au, Ni, Nd, Ir, Cr, Li, Ca, or an alloy thereof. In some embodiments, the second electrode 340 may further include a TCO layer such as ITO, IZO, ZnO, or $In_2O_3$ on the transparent (or translucent) layer including the above material.

When the first electrode 310 includes a reflection electrode and the second electrode 340 includes a (semi-)light-transmissive electrode, light emitted from the intermediate layer 320 may be emitted towards the second electrode 340, and thus, a display apparatus including the first light-emitting diode LED1 may be of a top emission type. According to some embodiments, when the first electrode 310 includes a (semi-)light-transmissive electrode and the second electrode 340 includes a reflection electrode, light emitted from the intermediate layer 320 may be emitted towards the substrate 100, and thus, a display apparatus may be of a bottom emission type. However, the present disclosure is not limited thereto. According to some embodiments, the display apparatus may be of a dual-emission type in which light is emitted in two directions, that is, towards front and rear surfaces.

As illustrated in FIG. 7, the auxiliary line 240 may be formed in a manner that a width of the upper layer 241 on the main sub-layer 242 is greater than a width of an upper surface 242$t$ of the main sub-layer 242. In other words, the upper layer 241 may include a tip T protruding, in a lateral direction, from a first point P1 in which a side surface 242$s$ of the main sub-layer 242 meets the upper surface 242$t$ thereof. Such a structure may be formed during a process of etching a portion of the auxiliary line 240 exposed through the first opening 107OP, for example, an etching process using an etchant while the first electrode 310 is formed.

The tip T of the upper layer 241 may have a shape curved upwards from the first point P1. In other words, a height of an end portion of the curved tip T may be greater than a height of the first point P1. For example, the end portion of the curved tip T may be at a higher level than a virtual plane (e.g., a virtual plane substantially the same as the upper surface 242t of the main sub-layer 242) on which the first point P1 is located. Here, the description that the end portion of the curved tip T is on the virtual plane may indicate that the end portion of the curved tip T is apart from the virtual plane in a vertical direction z away from the substrate (100 of FIG. 6) or the interlayer insulating layer 105. Such a structure may be formed while the auxiliary layer 330 is deposited on the upper layer 241, and a detailed process is described with reference to FIGS. 8A and 8B.

The intermediate layer 320, the auxiliary layer 330, and the second electrode 340 may be deposited in a direction (a z direction) perpendicular to the substrate 100 and a direction oblique to the direction. Because the upper layer 241 of the auxiliary line 240 includes the tip T protruding from the main sub-layer 242 on a cross-sectional view, the intermediate layer 320, the auxiliary layer 330, and the second electrode 340 may be respectively disconnected with respect to the auxiliary line 240. For example, the intermediate layer 320, the auxiliary layer 330, and the second electrode 340 may respectively include portions on the upper layer 241 of the auxiliary line 240 and portions that are on both sides of the auxiliary line 240 while being disconnected or separated from the above portions.

A portion 320R of the intermediate layer 320 may be on an upper surface of the auxiliary line 240, and another portion (or other portions) 320S of the intermediate layer 320 adjacent to the auxiliary line 240 may directly contact the side surface 242s of the main sub-layer 242.

A portion 330R of the auxiliary layer 330 may be on an upper surface of the intermediate layer 320 that is on an upper portion of the auxiliary line 240, and another portion (or other portions) 330S of the auxiliary layer 330 that is (are) adjacent to the auxiliary line 240 may directly contact the side surface 242s of the main sub-layer 242 and form a first contact region CR. For example, FIG. 7 illustrates that other portions 320S of the intermediate layer 320, which are arranged on both sides of a portion 320R of the intermediate layer 320 while separated from the portion 320R thereof, may respectively contact the side surfaces 242s of the main sub-layer 242 and thus may form a first contact region CR, but one or more embodiments are not limited thereto. In other embodiments, the other portions 330S of the auxiliary layer 330 may not contact the side surfaces 242s of the main sub-layer 242.

When the auxiliary layer 330 includes the first contact region CR contacting the side surface of the auxiliary line 240, the auxiliary layer 330 includes a conductive material, and thus, contact resistance between the auxiliary line 240 and the second electrode 340 contacting the upper surface of the auxiliary layer 330 may decrease.

The second electrode 340 may include a portion 340R arranged on the upper surface of the auxiliary line 240 and other portions 340S arranged on both sides of the auxiliary line 240 and separated from the portion 340R.

The portion 340R of the second electrode 340 may be on the portion 330R of the auxiliary layer 330. Both ends of the portion 340R of the second electrode 340 may extend to a portion of a lower surface of the upper layer 241 of the auxiliary line 240 while covering layers arranged under the second electrode 340.

The other portions 340S of the second electrode 340 may directly contact the side surfaces 242s of the main sub-layer 242 and form a second contact region CCR. As illustrated in FIG. 7, because the tip T of the upper layer 241 of the auxiliary line 240 is curved upwards, a contact region between the second electrode 340 and the side surfaces 242s of the main sub-layer 242, for example, the second contact region CCR, may increase, compared to a case where the tip T is not curved.

In some embodiments, when the intermediate layer 320 includes the first functional layer 321, the emission layer 322, and the second functional layer 323, the first functional layer 321, the emission layer 322, and the second functional layer 323 may be separated from each other with respect to the auxiliary line 240, as illustrated in FIG. 7. Therefore, the first functional layer 321, the emission layer 322, and the second functional layer 323 may respectively include portions 321R, 322R, and 323R on the upper layer 241 of the auxiliary line 240 and portions 321S, 322S, and 323S arranged on both sides of the auxiliary line 240 with respect to the auxiliary line 240.

Referring to FIGS. 6 and 7, a light-emitting diode having a multilayered structure of the first electrode 310, the intermediate layer 320, and the second electrode 340, for example, the first light-emitting diode LED1, is covered by the encapsulation layer 400. The encapsulation layer 400 may include at least one inorganic encapsulation layer and at least one organic encapsulation layer. According to some embodiments, the encapsulation layer 400 may include a first inorganic encapsulation layer 410, an organic encapsulation layer 420 on the first inorganic encapsulation layer 410, and a second inorganic encapsulation layer 430 on the organic encapsulation layer 420.

The first and second inorganic encapsulation layers 410 and 430 may each include one or more inorganic insulating materials. The inorganic insulating materials may include aluminum oxide, tantalum oxide, hafnium oxide, zinc oxide, silicon oxide, silicon nitride, and/or silicon oxynitride. The first and second inorganic encapsulation layers 410 and 430 may be formed through CVD. Because the first inorganic encapsulation layer 410 has a relatively great step coverage, the first inorganic encapsulation layer 410 may entirely cover the auxiliary line 240 even though the auxiliary line 240 has a shape having the tip (T of FIG. 7). For example, the first inorganic encapsulation layer 410 may continuously extend to cover portions of the intermediate layer 320, the second electrode 340, and the auxiliary layer 330 arranged outside of the auxiliary line 240, part of the side surfaces 242s of the main sub-layer 242, part of the lower surface and/or the side surfaces of the upper layer 241, the portion 320R of the intermediate layer 320 on the auxiliary line 240, the portion 340R of the second electrode 340, and the portion 330R of the auxiliary layer 330.

The organic encapsulation layer 420 may include a polymer-based material. The polymer-based material may include acryl-based resin, epoxy-based resin, polyimide, polyethylene, or the like. The acryl-based resin may include, for example, polymethyl methacrylate (PMMA), polyacrylic acid, or the like.

The color conversion-penetration layer 500 and the color layer 600 may be arranged on the encapsulation layer 400. FIG. 6 illustrates that the first color converter 510 of the color conversion-penetration layer 500 overlaps the first light-emitting diode LED1 and the first color filter 610 of the color layer 600 overlaps the first light-emitting diode LED1. The first color converter 510 and the first color filter 610 may be respectively surrounded by the light-shielding portions 540 and 640, and FIG. 6 illustrates the light-shielding portions 540 and 640 arranged on both sides of the first color converter 510 and the first color filter 610. The light-shielding portions 540 and 640 may include light-shielding materials such as a black matrix, and the auxiliary line 240 may overlap the light-shielding portions 540 and 640.

Figure 8A:
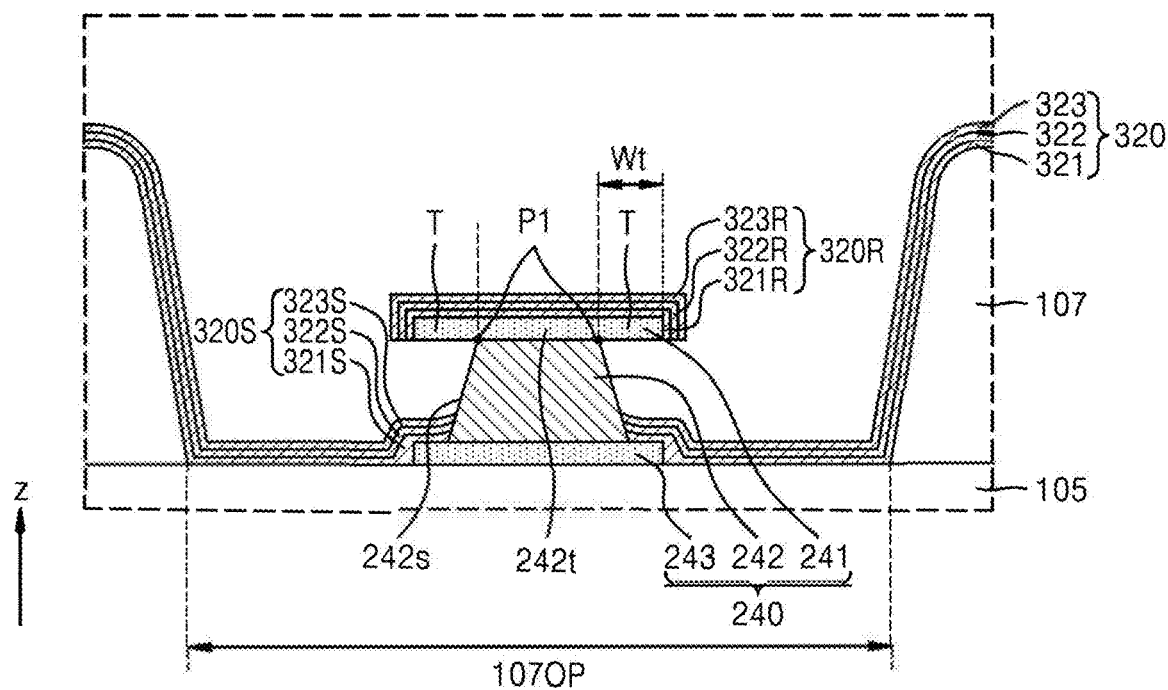
FIGS. 8A to 8C are cross-sectional views sequentially illustrating a manufacturing method of a display apparatus of FIG. 7 according to some embodiments.
Figure 8B:
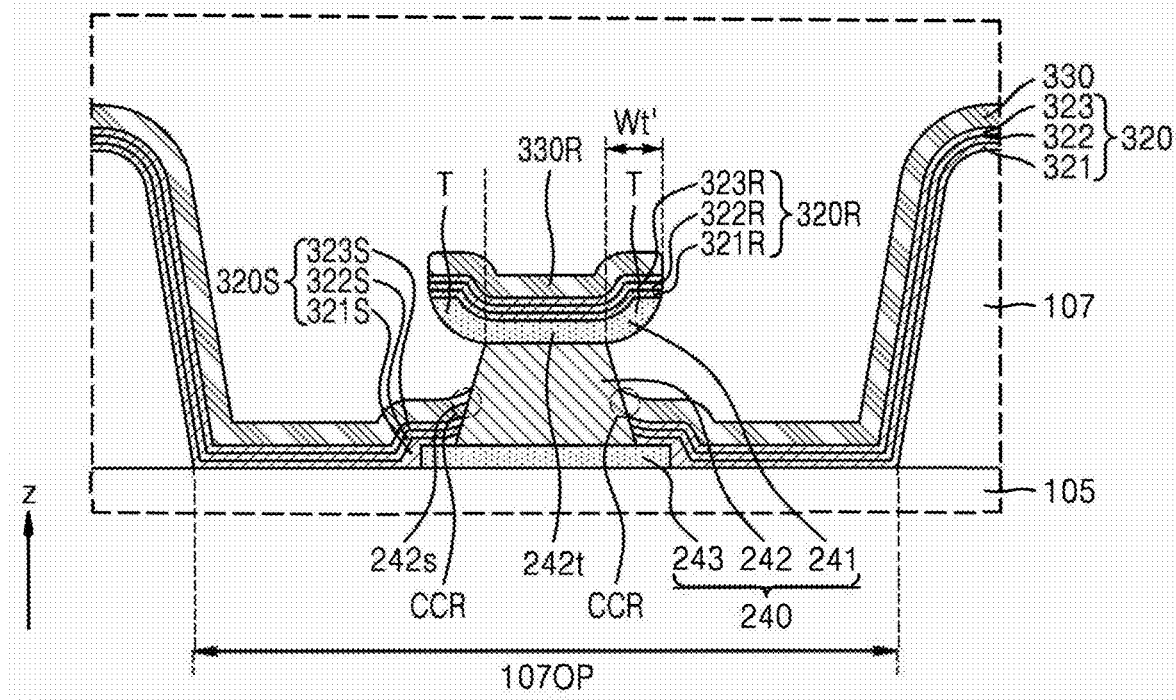
Figure 8C:
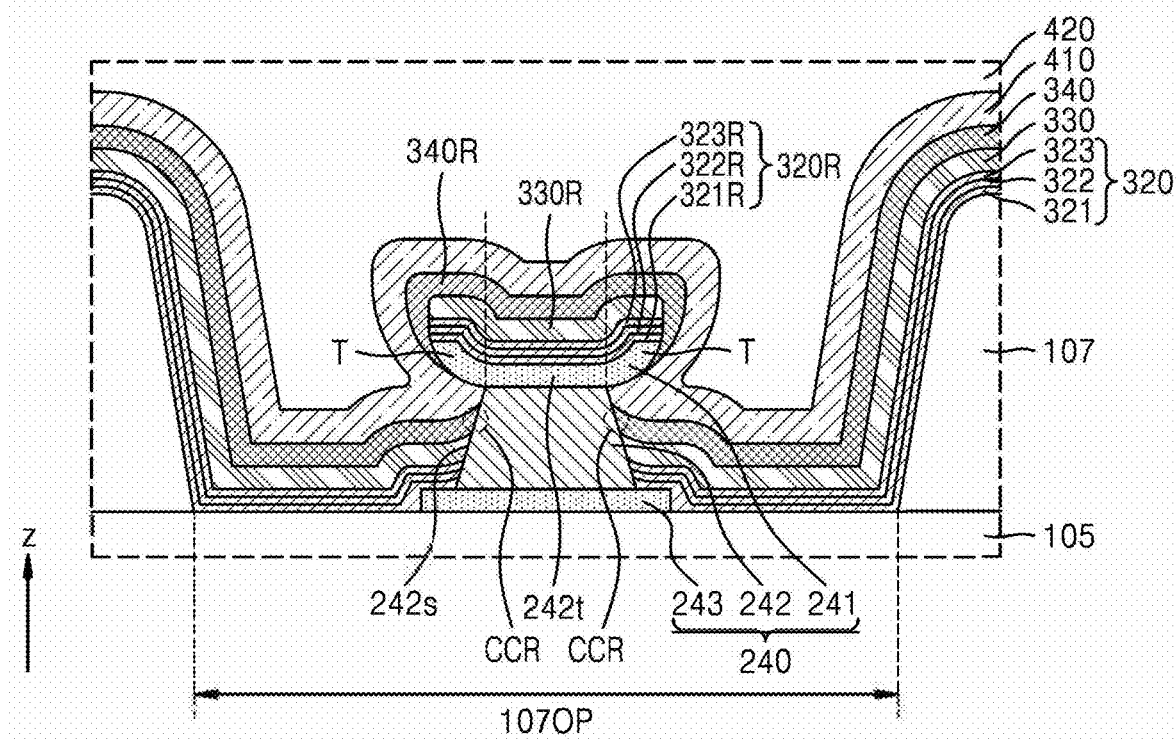

FIGS. 8A to 8C are cross-sectional views sequentially illustrating a manufacturing method of a display apparatus of FIG. 7. The same reference symbols in FIGS. 6 to 8C denote the same elements, and thus, repeated descriptions thereof are not provided.

Referring to FIG. 8A, the auxiliary line 240 may be formed on the interlayer insulating layer 105, and the planarization insulating layer 107 including the first opening 107OP may be formed on the auxiliary line 240. After the planarization insulating layer 107 is formed, a portion of the auxiliary line 240 exposed through the first opening 107OP may be etched. For example, the etching process may be a wet etching process using an etchant. The etching of the auxiliary line 240 may be performed together with an etching process of forming the first electrode (310 of FIG. 6) on the planarization insulating layer 107.

A material of the main sub-layer 242 of the auxiliary line 240 may include a material having a different etch selectivity from a material of the upper layer 241. A material of the lower layer 243 may include a material having a different etch selectivity from that of the main sub-layer 242, and in some embodiments, the lower layer 243 may include the same material as the upper layer 241. As the main sub-layer 242 is over-etched compared to the upper layer 241 because of the etchant used in the etching process, the tip T may be formed on the upper layer 241 as illustrated in FIG. 8A. The tip T may protrude, in the lateral direction, from the first point P1 in which the upper surface 242s of the main sub-layer 242 meets the side surfaces thereof.

Next, the intermediate layer 320 may be formed on the auxiliary line 240 having the tip T. The intermediate layer 320 may be deposited using a mask having an opening corresponding to the display area DA, and thus, the intermediate layer 320 may entirely cover the display area DA.

The intermediate layer 320 may be formed through the deposition. In a deposition process, a material forming the intermediate layer 320 may propagate in the direction (the z direction) perpendicular to the substrate (100 of FIG. 6) and the direction oblique thereto.

The intermediate layer 320 may be disconnected or separated with respect to the auxiliary line 240 because of the shape of the auxiliary line 240. For example, the portion 320R of the intermediate layer 320 may be formed on the upper surface of the auxiliary line 240, but the other portions 320S may be respectively formed on both sides of the auxiliary line 240 while separated/disconnected from the portion 320R.

The portion 320R of the intermediate layer 320, for example, the portion 321R of the first functional layer 321, the portion 322R of the emission layer 322, and the portion 323R of the second functional layer 323, may be on the upper surface of the upper layer 241, but both end portions of the intermediate layer 320 may be on the side surfaces of the upper layer 241. Other portions 240S of the auxiliary line 240 may contact the side surfaces of the auxiliary line 240, for example, the side surfaces 242s of the main sub-layer 242.

Referring to FIG. 8B, the auxiliary layer 330 may be formed on the intermediate layer 320. The auxiliary layer 330 may be disconnected or separated with respect to the auxiliary line 240 because of the shape of the auxiliary line 240. For example, the portion 330R of the auxiliary layer 330 may be formed on the auxiliary line 240, and the other portions 330S may be respectively formed on both sides of the auxiliary line 240 while disconnected/separated from the portion 330R.

According to some embodiments, the auxiliary layer 330 may be formed through sputtering. According to some embodiments, the auxiliary layer 330 may be formed through CVD. When the auxiliary layer 330 is deposited through sputtering, internal stress of the auxiliary layer 330 may be adjusted according to pressure conditions.

The auxiliary layer 330 may be formed under a high-pressure atmosphere that is greater than or equal to about 7 mTorr. In some embodiments, the auxiliary layer 330 may be formed at a pressure greater than or equal to about 8 mTorr, and in some embodiments, the auxiliary layer 330 may be formed at a pressure greater than or equal to about 10 mTorr.

When the auxiliary layer 330 is deposited under the above pressure condition, the tensile strength may be applied to the upper layer 241 of the auxiliary line 240. Therefore, the tip T protruding from the first point P1 of the upper layer 241 in the lateral direction may be curved upwards (in the z direction). As the tip T of the upper layer 241 is curved, the intermediate layer 320 on the upper surface of the upper layer 241 may also be curved.

As a comparative example, when the auxiliary layer 330 is deposited at a pressure lower than the above pressure condition the compressive strength may be applied to the upper layer 241 of the auxiliary line 240, and the tip T may be curved downwards. In this case, during a process of forming the second electrode (240 of FIG. 8C) described below with reference to FIG. 8C, it may be difficult to secure an area of a contact region where the second electrode 340 contacts the auxiliary line 240.

Because of the auxiliary layer 330 formed under the above pressure condition, the height of the end of the tip T of the upper layer 241 may be greater than the height of the first point P1. Here, the height may indicate a distance measured, in a vertical direction, from the bottom surface of the auxiliary line 240 or the upper surface of the interlayer insulating layer 105. Also, a width Wt' of the tip T of the upper layer 241 after the auxiliary layer 330 is formed may be less than the width Wt of the tip T before the auxiliary layer 330 is formed.

Referring to FIG. 8C, the second electrode 340 may be formed on the upper portion of the auxiliary layer 330. Similarly to the intermediate layer 320 and the auxiliary layer 330, the second electrode 340 may be deposited in the direction perpendicular to the substrate (100 of FIG. 6) (the z direction) and the direction oblique thereto. For example, the second electrode 340 may be deposited in a direction having a certain incidence angle with respect to the z direction.

An incidence angle, at which the second electrode 340 is deposited, may be identical or similar to an incidence angle, at which the intermediate layer 320 is deposited. Because the auxiliary line 240 has an eaves structure having tips T on both sides, areas (hereinafter, deposition limited areas) where the intermediate layer 320 and the second electrode 340 are not deposited may be generated because of the eaves structure. The description that the incidence angle, at which the second electrode 340 is deposited, is identical or similar to the incidence angle, at which the intermediate layer 320 is deposited, may indicate that the deposition limited areas where the intermediate layer 320 and the second electrode 340 are not deposited are substantially identical or similar to each other because of the eaves structure of the tip T. Thus, when the intermediate layer 320 is formed and then the second electrode 340 is formed, a contact area between the side surfaces 242s of the main sub-layer 242 and the second electrode 340, for example, the second contact region CCR, may be small. In this case, the contact resistance between the second electrode 340 and the auxiliary line 240 may increase, and the improvement in the voltage drop may be slight.

However, in embodiments of the disclosure, before the second electrode 340 is deposited after the intermediate layer 320 is deposited, an operation, in which the auxiliary layer 330 is formed under a high-pressure condition, may be included. While the auxiliary layer 330 is formed, the tip T of the upper layer 241 of the auxiliary line 240 may be curved upwards. As described above, the width (Wt' of FIG. 8B) of the curved tip T may be less than the width (Wt of FIG. 8A) of the tip T before the auxiliary layer 330 is formed, and thus, a limitation range of deposition under the tip T may be reduced. Therefore, a contact area between the side surfaces of the auxiliary line (e.g., the side surfaces 242s of the main sub-layer 242) and the second electrode 340, for example, the second contact region CCR, may increase, and the contact resistance between the second electrode 340 and the auxiliary line 240 may decrease.

Figure 9:
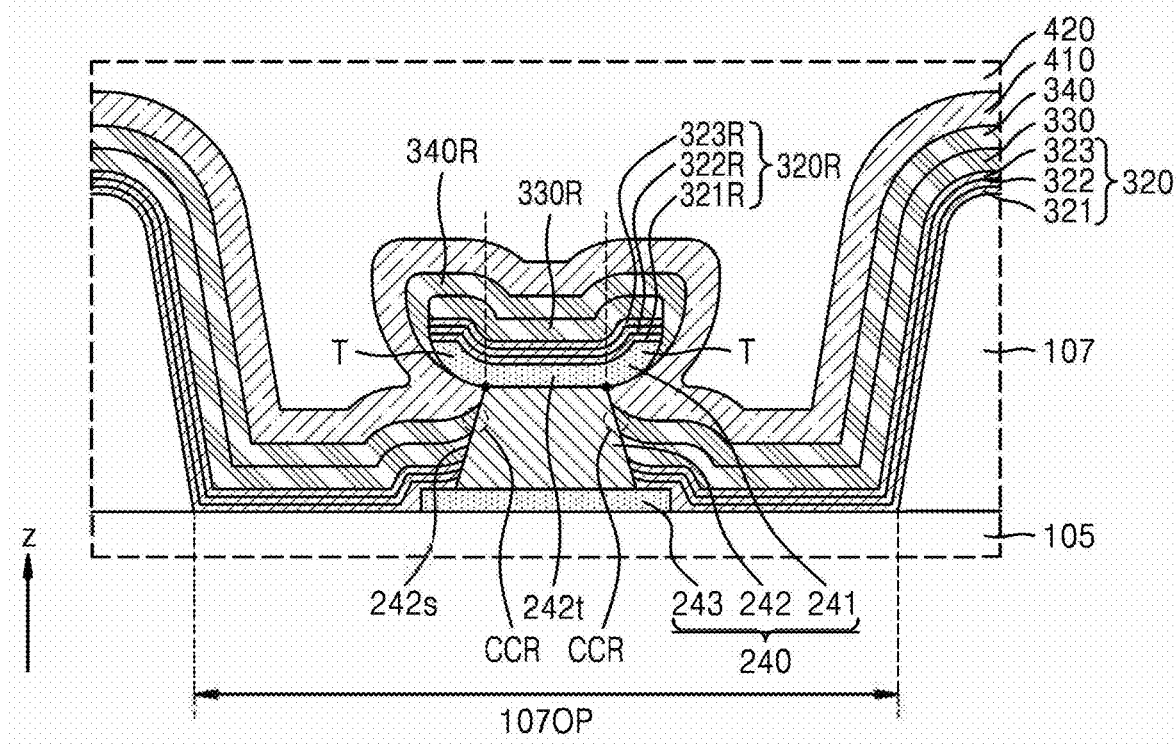
FIG. 9 is a cross-sectional view of a portion of a display apparatus, according to some embodiments.

Then, the first inorganic encapsulation layer 410 and the organic encapsulation layer 420 that cover the intermediate layer 320, the auxiliary layer 330, the second electrode 340, and the auxiliary line 240 may be formed. Because the first inorganic encapsulation layer 410 has a relatively better step coverage than the second electrode 340, the first inorganic encapsulation layer 410 may not be disconnected by the tip T. As illustrated in FIG. 9, the first inorganic encapsulation layer 410 may be continuously formed around the auxiliary line 240.

FIG. 9 is a cross-sectional view of a portion of a display apparatus, according to some embodiments. According to the embodiments described with reference to FIGS. 8A to 8C, the second electrode 340 includes a different material from the auxiliary layer 330, but in the display apparatus of FIG. 9, the second electrode 340 includes the same material as the auxiliary layer 330.

In some embodiments, the second electrode 340 may include the same material as the auxiliary layer 330. For example, the second electrode 340 includes the same material as the auxiliary layer 330 and may include TCO such as ITO, GZO, and/or IZO. The second electrode 340 and the auxiliary layer 330 may include the TCO, but may be formed under different formation conditions. As described above with reference to FIGS. 8A to 8C, the auxiliary layer 330 may be formed under the relatively high-pressure conditions so that the tip T may be curved upwards. On the contrary, the second electrode 340 may be formed at a lower pressure than the auxiliary layer 330 not to deform the tip T. Because the auxiliary layer 330 and the second electrode 340 are formed under different pressure conditions, a boundary therebetween may be viewed on a cross-sectional view.

Figure 10A:
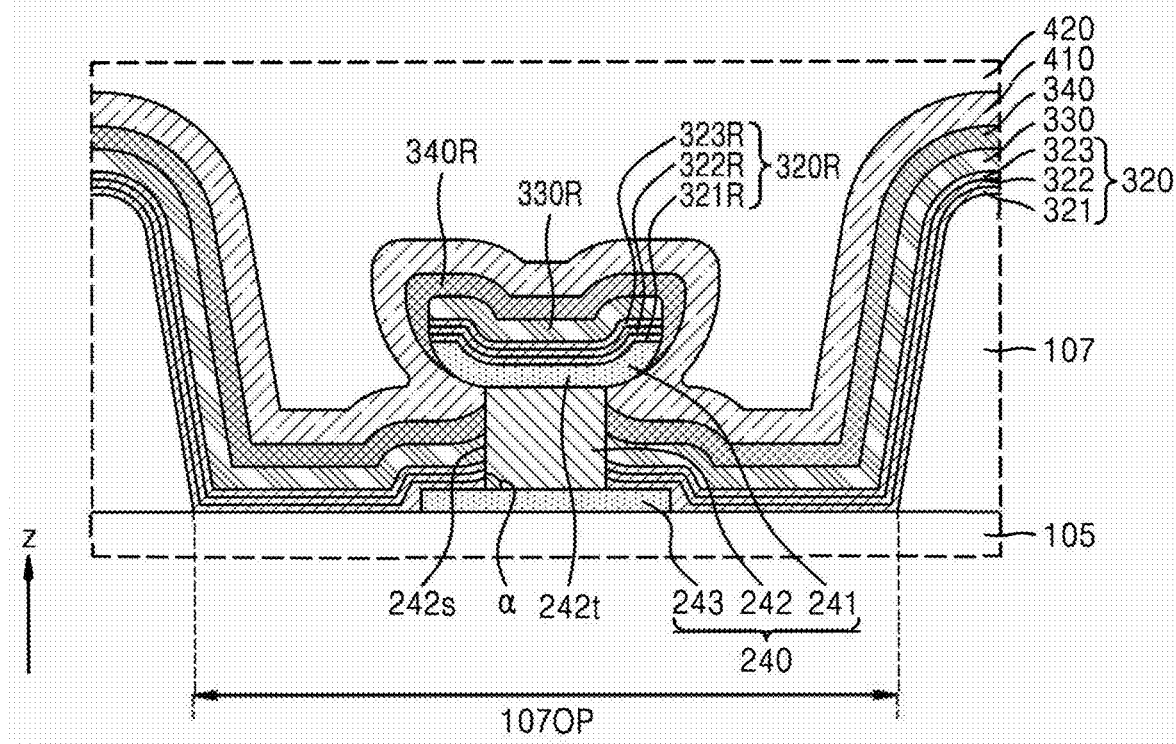
FIGS. 10A and 10B are cross-sectional views respectively illustrating an auxiliary line according to some embodiments.
Figure 10B:
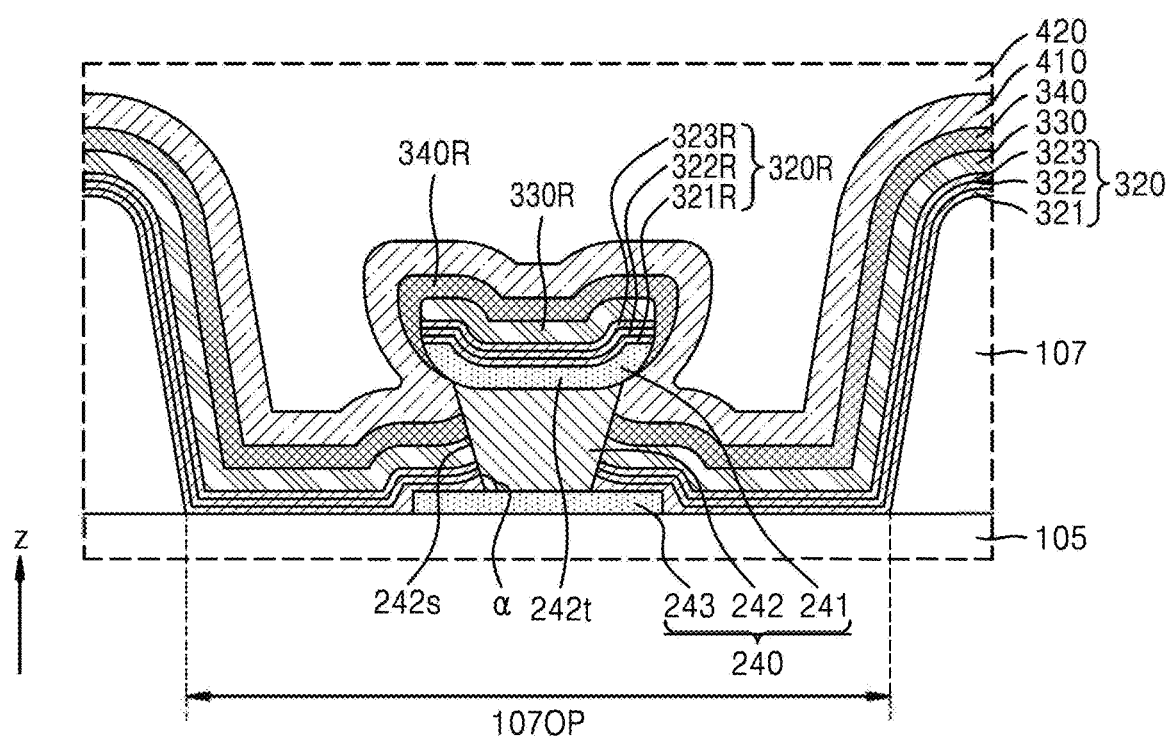

FIGS. 10A and 10B are cross-sectional views respectively illustrating an auxiliary line according to some embodiments. FIGS. 10A and 10B are modified examples of FIG. 7, and the same reference symbols in FIGS. 7 and 10A and 10B denote the same element; thus, repeated descriptions thereof are not provided. According to the auxiliary line 240 described with reference to FIG. 7, an inclination angle α of the side surface 242s of the main sub-layer 242 may be equal to or greater than about 20 degrees and less than about 90 degrees, and the side surfaces 242s of the main sub-layer 242 are tapered in a forward direction. According to some embodiments, the shape of the side surface 242s of the main sub-layer 242 may be as illustrated in FIGS. 10A and 10B.

As illustrated in FIG. 10A, the inclination angle α of the side surface 242s of the main sub-layer 242 may be about 90 degrees. That is, a cross-section of the main sub-layer 242 may have a rectangular shape. In some embodiments, as illustrated in FIG. 10B, the inclination angle α of the side surface 242s of the main sub-layer 242 may be greater than about 90 degrees and less than or equal to about 135 degrees. That is, the side surfaces 242s of the main sub-layer 242 are tapered in a reverse direction.

Figure 11:
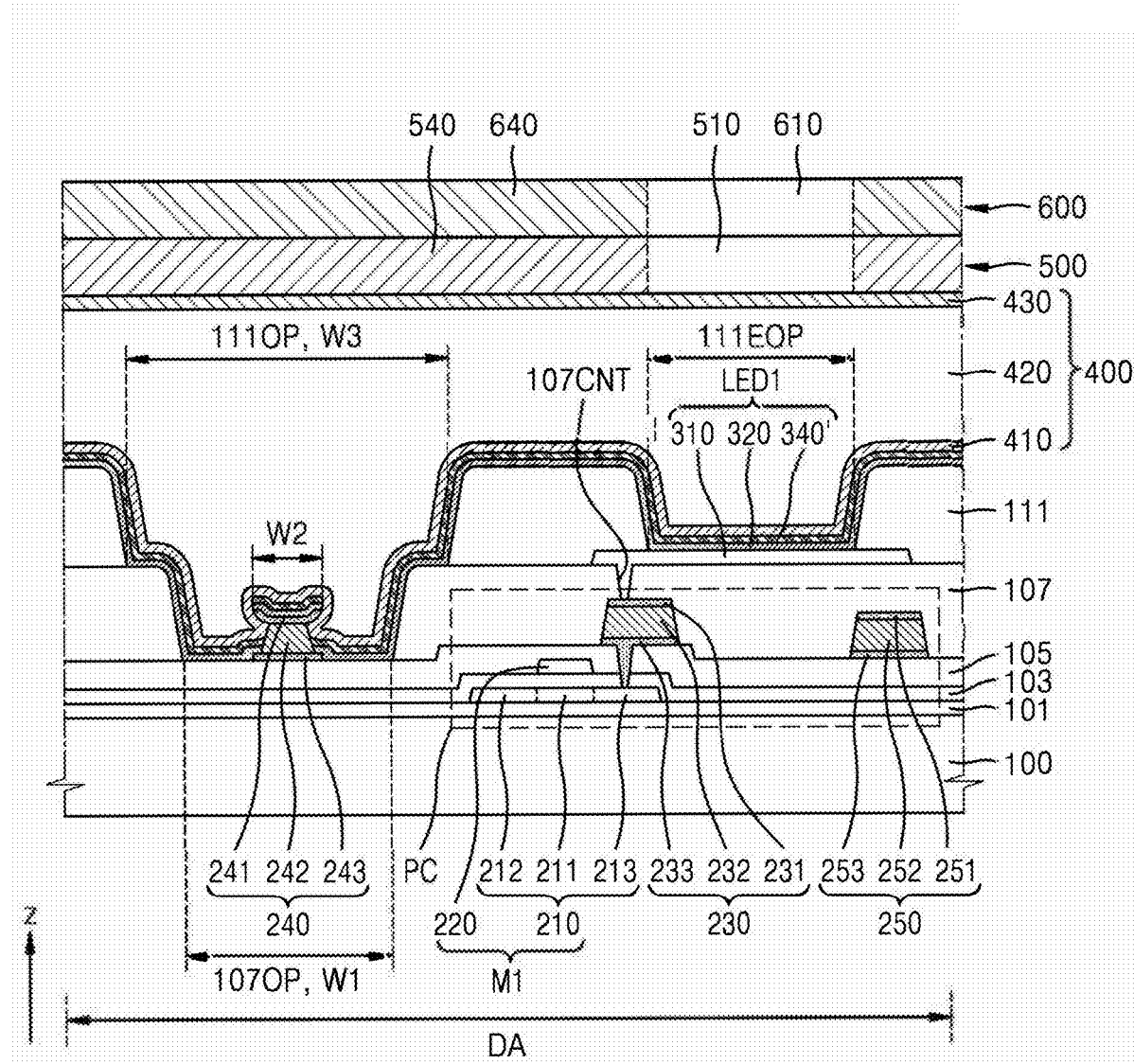
FIG. 11 is a cross-sectional view of a portion of a display apparatus, according to an embodiment.

FIG. 11 is a cross-sectional view of a portion of a display apparatus, according to some embodiments. The same reference symbols in FIGS. 6, 7, 9, and 11 denote the same elements, and thus, repeated descriptions thereof are not provided.

Referring to FIG. 11, the first light-emitting diode LED1 on the substrate 100 may include the first electrode 310, the intermediate layer 320, and a second electrode 340'. The second electrode 340' may overlap the auxiliary line 240 and the first electrode 310 and may be arranged on the intermediate layer 320.

In some embodiments, the second electrode 340' may include a transparent conductive material. For example, the second electrode 340' may include TCO such as ITO, GZO, and/or IZO, and the above TCO may be amorphous or crystalline. In this case, the intermediate layer 320 may be omitted unlike the embodiments of FIGS. 6 and 9.

A manufacturing method of the first electrode 310, the auxiliary line 240, and the intermediate layer 320 of FIG. 11 is the same as that described with reference to FIG. 9 (FIGS. 8A to 8C). A manufacturing method of the second electrode 340' of FIG. 11 may be the same as the process of forming the auxiliary layer 330 described with reference to FIG. 9 (FIGS. 8A to 8C). In this case, a process of forming the second electrode 340 on the auxiliary layer 330 described with reference to FIG. 9(FIGS. 8A to 8C) may be omitted.

FIG. 12 is an image obtained by examining a shape of an auxiliary line by using transmission electron microscopy (TEM), according to some embodiments.

Referring to FIG. 12, the upper layer 241 of the auxiliary line 240 includes the tip T, and the tip T may be curved upwards as described above with reference to FIG. 7. In other words, the tip T may have a lower surface Tb that is inclined at a certain angle in the z direction with respect to a virtual plane G that is substantially parallel to the upper surface 242t of the main sub-layer 242. In some embodiments, an angle β, which is formed by the lower surface Tb of the tip T with respect to the virtual plane G, may be between 0 degree and about 45 degrees or may be about 45 degrees.

The side surface Ts of the tip T may be located on a plane crossing the virtual plane G that is the same as the upper surface 242t of the main sub-layer 242. For example, FIG. 7 illustrates that the curvature of the tip T is relatively great so that the side surface (Ts, or the side surface of the upper layer 241) of the tip T is substantially parallel to the upper surface of the upper layer 241, but FIG. 12 illustrates that the curvature of the tip T is less than the curvature in the embodiments described with reference to FIG. 7. In this case, the side surface (Ts, or the side surface of the upper layer 241) of the tip T may be located on the plane crossing the virtual plane G.

According to the one or more embodiments, a display apparatus may have relative improved display quality by overcoming a voltage drop caused by wiring resistance. However, the scope of the present disclosure is not limited by the effect above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
    an auxiliary line comprising a main sub-layer and an upper layer on the main sub-layer;
    an insulating layer comprising a first opening having a greater width than the auxiliary line, wherein the first opening overlaps the auxiliary line;
    a first electrode on the insulating layer;
    an intermediate layer overlapping the first electrode and comprising an emission layer;
    an auxiliary layer, at least a portion of which overlaps the auxiliary line; and
    a second electrode on the auxiliary layer,
    wherein the upper layer of the auxiliary line comprises a tip protruding, in a lateral direction, from a first point, in which a side surface and an upper surface of the main sub-layer meet each other, and being curved upwards from the first point, and
    the second electrode contacts the side surface of the main sub-layer through the first opening of the insulating layer.

2. The display apparatus of claim 1, wherein the auxiliary layer comprises a transparent conductive material.

3. The display apparatus of claim 1, wherein the auxiliary layer comprises:
    a first portion on the upper layer of the auxiliary line; and
    a second portion separated from the first portion by the tip.

4. The display apparatus of claim 3, wherein the second portion of the auxiliary layer contacts the side surface of the main sub-layer.

5. The display apparatus of claim 1, wherein the second electrode comprises a different material from the auxiliary layer.

6. The display apparatus of claim 1, wherein the main sub-layer comprises at least one of copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), or molybdenum (Mo).

7. The display apparatus of claim 1, wherein the auxiliary line further comprises a lower layer under the main sub-layer, and
    a thickness of the main sub-layer is greater than at least one of thicknesses of the upper layer or the lower layer.

8. The display apparatus of claim 7, wherein at least one of the upper layer or the lower layer comprises at least one of indium tin oxide (ITO), titanium (Ti), molybdenum (Mo), or tungsten (W).

9. The display apparatus of claim 1, wherein the intermediate layer overlaps the first electrode and the auxiliary line, and a portion of the intermediate layer is on the auxiliary line while separated, by the tip, from another portion of the intermediate layer around the auxiliary line.

10. The display apparatus of claim 1, wherein the second electrode overlaps the first electrode and the auxiliary line, and a portion of the second electrode is on the auxiliary line while separated, by the tip, from another portion of the second electrode around the auxiliary line.

11. A display apparatus comprising:
    an auxiliary line comprising a main sub-layer and an upper layer on the main sub-layer;
    an insulating layer comprising a first opening having a greater width than the auxiliary line, wherein the first opening overlaps the auxiliary line;
    a first electrode on the insulating layer;
    an intermediate layer overlapping the first electrode and comprising an emission layer; and
    a transparent conductive material layer overlapping the intermediate layer and the auxiliary line,
    wherein the upper layer of the auxiliary line comprises a tip protruding, in a lateral direction, from a first point, in which a side surface and an upper surface of the main sub-layer meet each other, and curved upwards from the first point.

12. The display apparatus of claim 11, wherein the transparent conductive material layer comprises:
    a first portion on the upper layer of the auxiliary line; and
    a second portion separated from the first portion by the tip,
    wherein the second portion of the transparent conductive material layer directly contacts the side surface of the main sub-layer of the auxiliary line.

13. The display apparatus of claim 11, further comprising a second electrode on the transparent conductive material layer.

14. The display apparatus of claim 13, wherein the second electrode comprises a different material from the transparent conductive material layer.

15. The display apparatus of claim 11, wherein the auxiliary line further comprises a lower layer under the main sub-layer, and
    a thickness of the main sub-layer is greater than at least one of thicknesses of the upper layer or the lower layer.

16. The display apparatus of claim 11, wherein the transparent conductive material layer comprises at least one of indium tin oxide (ITO), gallium zinc oxide (GZO), or indium zinc oxide (IZO).

17. A manufacturing method of a display apparatus, the manufacturing method comprising:
    forming an auxiliary line comprising a main sub-layer and an upper layer on the main sub-layer;
    forming an insulating layer comprising a first opening having a greater width than the auxiliary line, wherein the first opening overlaps the auxiliary line;
    forming a first electrode on the insulating layer;
    forming an intermediate layer overlapping the first electrode and comprising an emission layer;
    forming a transparent conductive material layer overlapping the intermediate layer and the auxiliary line; and
    forming a second electrode on the transparent conductive material layer,
    wherein, in the forming of the second electrode on the transparent conductive material layer, the second electrode contacts a side surface of the main sub-layer of the auxiliary line, and the surface of the main sub-layer is located under a tip of the upper layer, the tip protruding, in a lateral direction, from a first point, in which the side surface and an upper surface of the main sub-layer meet each other, and curved upwards from the first point.

18. The manufacturing method of claim 17, wherein the transparent conductive material layer is formed at a pressure equal to or greater than 7 mTorr.

19. The manufacturing method of claim 17, wherein the second electrode comprises a different material from the transparent conductive material layer.

20. The manufacturing method of claim 17, wherein the transparent conductive material layer is formed through sputtering.

* * * * *